US010600488B2

(12) United States Patent
Song et al.

(10) Patent No.: US 10,600,488 B2
(45) Date of Patent: *Mar. 24, 2020

(54) NON-VOLATILE MEMORY DEVICE INCLUDING DECOUPLING CIRCUIT

(71) Applicant: Samsung Electronics Co., Ltd., Suwon-si, Gyeonggi-do (KR)

(72) Inventors: Jung-ho Song, Anyang-si (KR); Se-heon Baek, Seoul (KR); Yong-sung Cho, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/186,840

(22) Filed: Nov. 12, 2018

(65) Prior Publication Data

US 2019/0080770 A1 Mar. 14, 2019

Related U.S. Application Data

(63) Continuation of application No. 15/495,072, filed on Apr. 24, 2017, now Pat. No. 10,192,624.

(30) Foreign Application Priority Data

Nov. 17, 2016 (KR) .......................... 10-2016-0153314

(51) Int. Cl.
*G11C 16/04* (2006.01)
*G11C 16/24* (2006.01)
(Continued)

(52) U.S. Cl.
CPC .......... *G11C 16/24* (2013.01); *G11C 16/0483* (2013.01); *G11C 16/12* (2013.01);
(Continued)

(58) Field of Classification Search
CPC ......... G11C 16/24; G11C 16/12; G11C 16/30; G11C 16/26; G11C 16/0483; G11C 2211/5642
(Continued)

(56) References Cited

U.S. PATENT DOCUMENTS 4,896,298 A * 1/1990 Kowalski ................. G11C 7/24
365/185.12
6,804,150 B2 10/2004 Park et al.
(Continued)

OTHER PUBLICATIONS

Final Office Action dated Oct. 20, 2017 for co-pending U.S. Appl. No. 15/495,072.
(Continued)

*Primary Examiner* — Huan Hoang
(74) *Attorney, Agent, or Firm* — Harness, Dickey & Pierce, P.L.C.

(57) ABSTRACT

A non-volatile memory device may include a memory cell array including a plurality of planes, a page buffer connected to the memory cell array and corresponding to each of the plurality of planes, and a decoupling circuit. The page buffer is configured to receive a bit line voltage control signal (BLSHF) via a first node. The decoupling circuit is connected to the first node. The decoupling circuit includes at least one decoupling capacitor configured to execute charge sharing via the first node.

20 Claims, 24 Drawing Sheets

(51) Int. Cl.
   *G11C 16/12* (2006.01)
   *G11C 16/26* (2006.01)
   *G11C 16/30* (2006.01)
(52) U.S. Cl.
   CPC .............. *G11C 16/26* (2013.01); *G11C 16/30* (2013.01); *G11C 2211/5642* (2013.01)
(58) Field of Classification Search
   USPC ..................................................... 365/185.12
   See application file for complete search history.

(56) References Cited

U.S. PATENT DOCUMENTS

| | | | |
|---|---|---|---|
| 6,925,005 | B2 | 8/2005 | Kawamura et al. |
| 7,518,945 | B2 | 4/2009 | Kim |
| 8,488,402 | B2 | 7/2013 | Shim et al. |
| 8,755,224 | B2 | 6/2014 | Yun et al. |
| 2006/0291288 | A1 | 12/2006 | Kang et al. |
| 2008/0080257 | A1 | 4/2008 | Park et al. |
| 2011/0122707 | A1 | 5/2011 | Yang et al. |
| 2016/0012903 | A1 | 1/2016 | Desai et al. |
| 2016/0267981 | A1 | 9/2016 | Hioka |

OTHER PUBLICATIONS

Final Office Action dated Apr. 24, 2018 for co-pending U.S. Appl. No. 15/495,072.

Notice of Allowance and Fee(s) Due dated Sep. 18, 2018 for co-pending U.S. Application No. 15/495,072.

\* cited by examiner

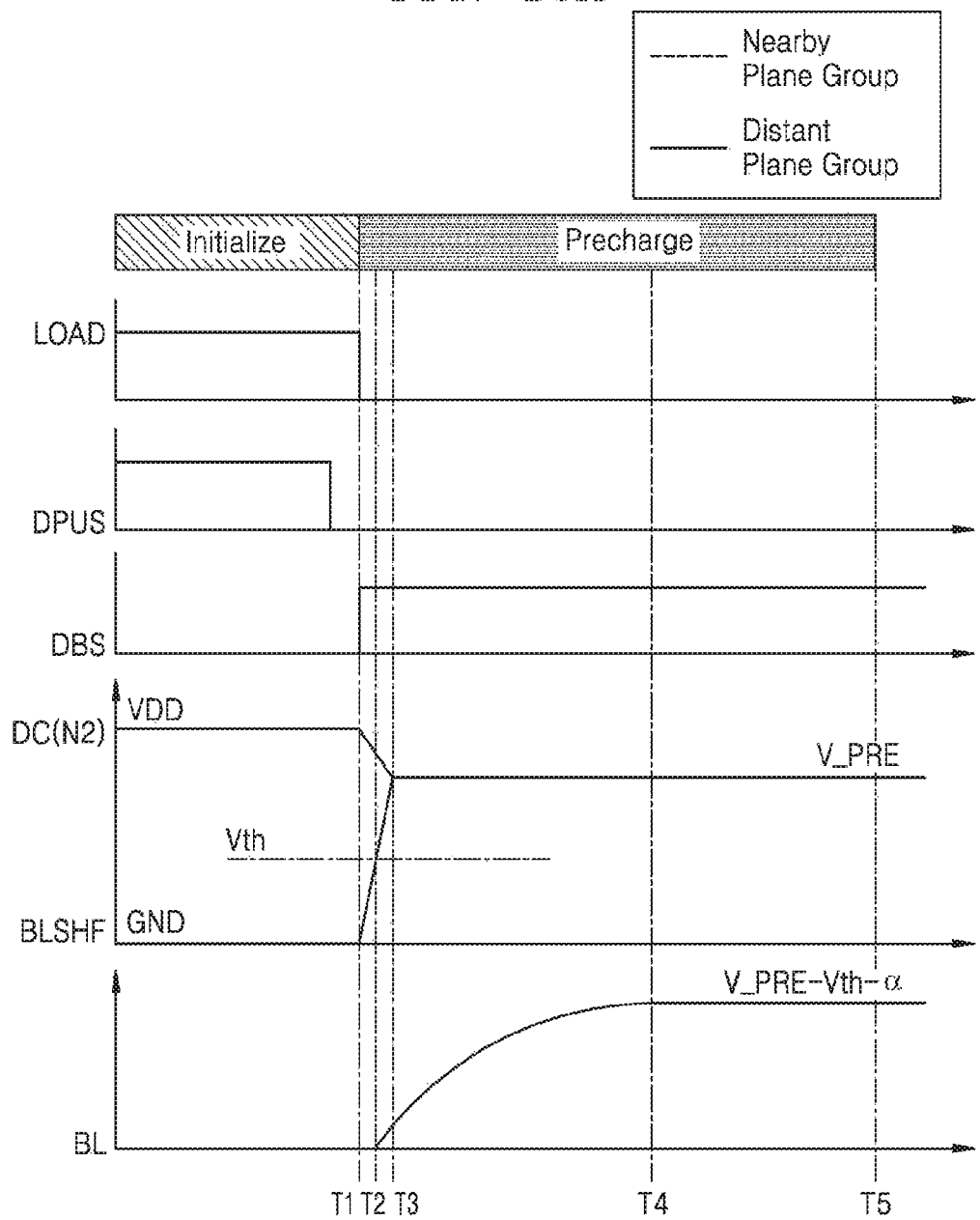

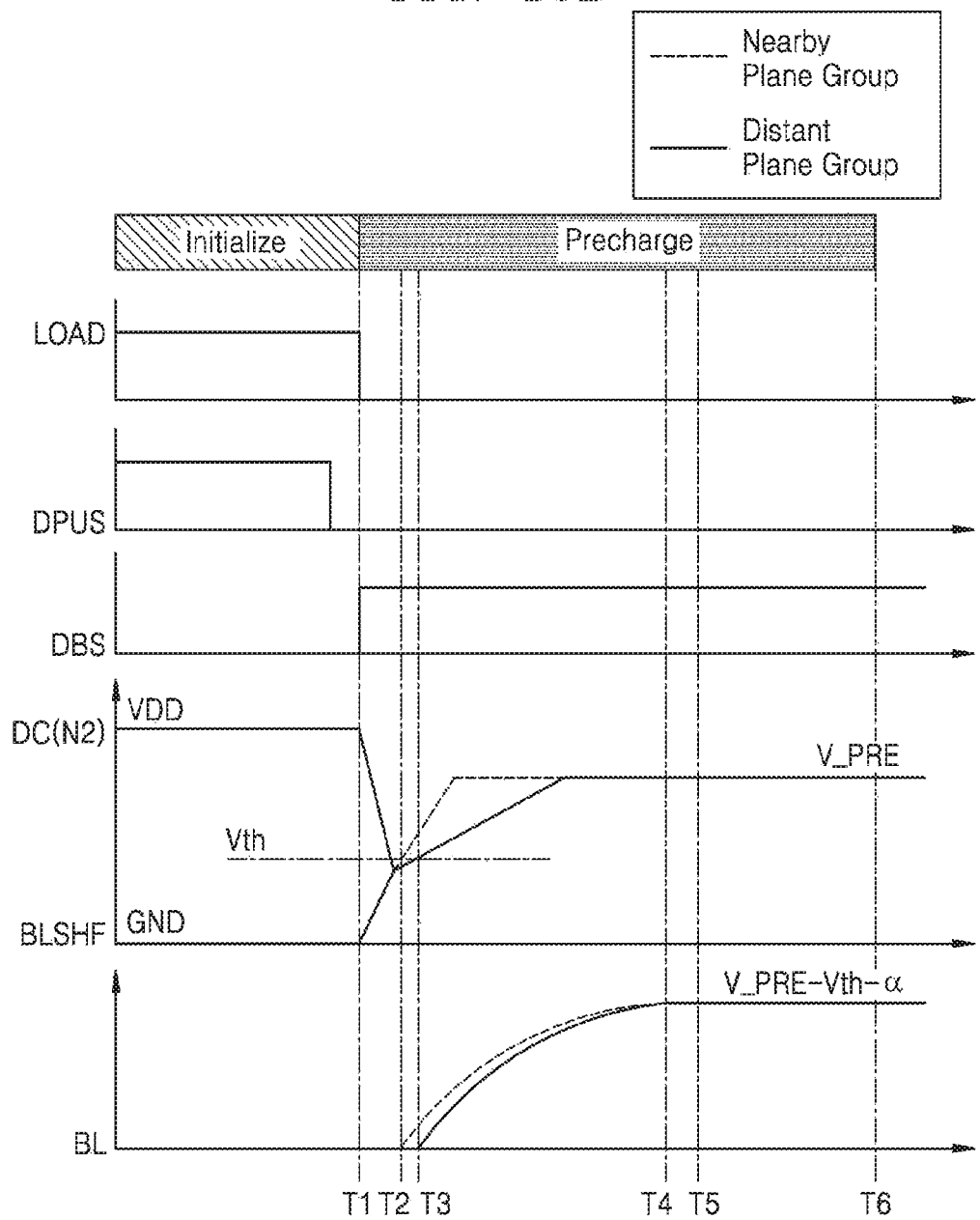

NON-VOLATILE MEMORY DEVICE INCLUDING DECOUPLING CIRCUIT

CROSS-REFERENCE TO RELATED APPLICATION

This application is a continuation application of U.S. application Ser. No. 15/495,072, filed Apr. 24, 2017, which claims priority under 35 U.S.C. § 119 to Korean Patent Application No. 10-2016-0153314, filed on Nov. 17, 2016, in the Korean Intellectual Property Office. The entire disclosure of each of the above-referenced applications is incorporated herein by reference.

BACKGROUND

Inventive concepts relate to a non-volatile memory device, and more particularly, to a non-volatile memory device including a decoupling circuit.

Semiconductor memory devices are memory devices realized by using semiconductors such as silicon (Si), germanium (Ge), gallium arsenide (GaAs), and indium phosphide (InP). Semiconductor memory devices are generally classified into volatile semiconductor memory devices and non-volatile semiconductor memory devices.

Non-volatile memory devices are memory devices in which data stored therein does not vanish even with a cut-off of power supply. Non-volatile memory devices may include read-only memories (ROMs), programmable ROMs (PROMs), erasable PROMs (EPROMs), electrically EPROMs (EEPROMs), flash memory devices, phase-change random-access memories (RAMs) (PRAMs), magnetoresistive RAMs (MRAMs), and ferroelectric RAMs (FRAMs). Flash memory devices may be largely classified into a NOR type and a NAND type.

SUMMARY

Inventive concepts relate to a non-volatile memory device in which sensing variations with respect to planes may be reduced.

According to some example embodiments of inventive concepts, a non-volatile memory device includes a memory cell array including a plurality of planes, a page buffer connected to the memory cell array and corresponding to each of the plurality of planes, and a decoupling circuit connected to a first node. The page buffer is configured to receive a bit line voltage control signal (BLSHF) via the first node. The decoupling circuit includes at least one decoupling capacitor and is configured to execute charge sharing via the first node.

According to some example embodiments of inventive concepts, a non-volatile memory device includes a memory cell array including a plurality of planes, a plurality of page buffers respectively connected to the plurality of planes, and a plurality of decoupling circuits respectively connected to the plurality of page buffers. The plurality of decoupling circuits respectively include at least one decoupling capacitor. Sensing for the plurality of planes may include a precharge stage and a bit line voltage develop stage. The plurality of decoupling circuits may be configured to maintain constant a difference in transition time between the plurality of planes in a process between the precharge stage and the bit line voltage develop stage.

According to some example embodiments of inventive concepts, a non-volatile memory device includes a memory cell array including a plurality of planes, a plurality of page buffers respectively connected to the plurality of planes, and a plurality of decoupling circuits respectively connected to the plurality of page buffers. The plurality of decoupling circuits may respectively each include at least one decoupling capacitor. The plurality of decoupling circuits may be configured to maintain constant a difference in transition time between the plurality of planes in a process from a precharge stage to a bit line voltage develop stage used for sensing the plurality of planes.

According to some example embodiments of inventive concepts, a non-volatile memory device includes a memory cell array includes a plurality of planes, a plurality of bit lines, a first node, a page buffer connected to the memory cell array through the plurality of bit lines, and a decoupling circuit. The page buffer is connected to the first node. The page buffer is configured to receive a bit line voltage control signal (BLSHF) via the first node. The decoupling circuit is connected to the first node such that the first node is between the page buffer and the decoupling circuit. The decoupling circuit includes at least one decoupling capacitor. The decoupling circuit is configured to reduce a transition time of a level of the BLSHF changing from a pre-charge voltage to a develop voltage at the first node if the level of the BLSHF received at the first node is changed from the pre-charge voltage to the develop voltage. The pre-charge voltage being different than the develop voltage.

BRIEF DESCRIPTION OF THE DRAWINGS

Inventive concepts will be more clearly understood from the following detailed description of non-limiting embodiments taken in conjunction with the accompanying drawings in which:

FIG. 16A is a timing diagram of an initializing stage and a pre-charge stage of a plane group according to some example embodiments of inventive concepts;

FIG. 16B is a timing diagram of an initializing stage and a pre-charge stage of a plane group according to some example embodiments of inventive concepts;

DETAILED DESCRIPTION

Figure 1:
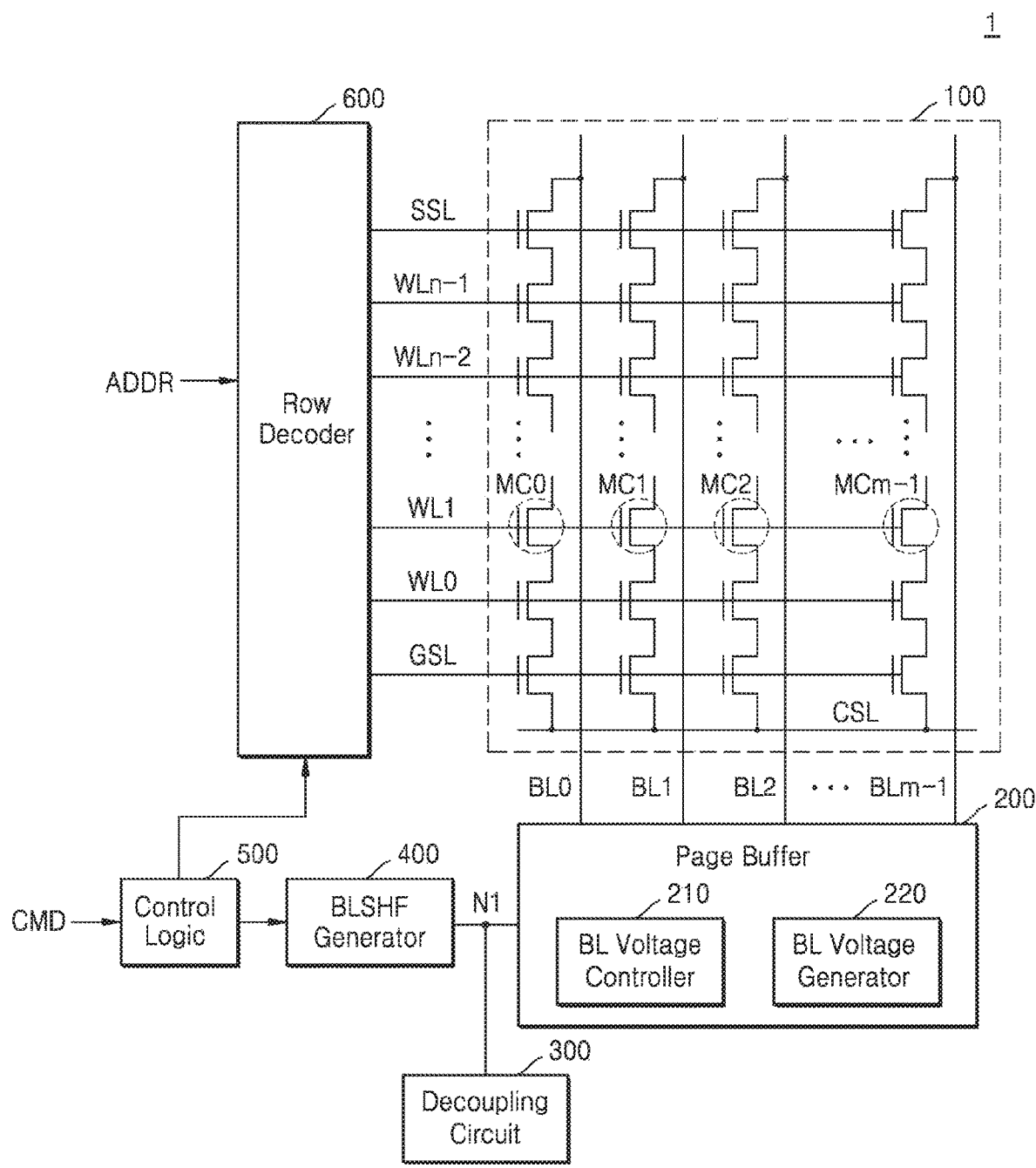
FIG. 1 is a block diagram of a non-volatile memory device according to some example embodiments of inventive concepts.

FIG. 1 is a block diagram of a non-volatile memory device 1 according to some example embodiments of inventive concepts.

Referring to FIG. 1, the non-volatile memory device 1 may include a memory cell array 100, a page buffer 200, a decoupling circuit 300, a bit line voltage control signal (BLSHF) generator 400, a control logic 500, and a row decoder 600. According to some example embodiments, the non-volatile memory device 1 is illustrated as a flash memory device. However, example embodiments are not limited thereto and may be applicable to all types of non-volatile memory devices such as read-only memories (ROMs), programmable ROMs (PROMs), erasable PROMs (EPROMs), electrically erasable PROMs (EEPROMs), flash memory devices, phase-change random-access memories (RAMs) (PRAMs), magnetoresistive RAMs (MRAMs), and ferroelectric RAMs (FRAMs).

The memory cell array 100 may be connected to the row decoder 600 via word lines WLs, a string selection line SSL, and a ground selection line GSL. The memory cell array 100 may be connected to the page buffer 200 via bit lines BL0 through BLm−1. The memory cell array 100 may include a plurality of NAND cell strings. Each of the cell strings may be connected to bit lines BLs via a string selection transistor SST. The memory cell array 100 may include planes including a plurality of memory blocks and the plurality of memory blocks may include a plurality of pages. The plurality of pages may include a plurality of memory cells.

The memory cell array 100 will be described in detail with reference to FIGS. 5 through 8.

The page buffer 200 may operate as a write driver or a sense amplifier depending on an operation mode. When the page buffer 200 operates as the write driver, the page buffer 200 may transfer a bit line voltage corresponding to data to be written as a bit line of the memory cell array 100. When the page buffer 200 operates as a sense amplifier (or read driver), the page buffer 200 may sense data stored in a selected memory cell via a bit line. The page buffer 200 may output sensed data to the outside by latching. The page buffer 200 may include a bit line voltage controller 210 and a bit line voltage generator 220. The bit line voltage controller 210 may include a plurality of transistors controlled by the BLSHF. In other words, the BLSHF output from the BLSHF generator 400 may be applied to respective gate terminals of the plurality of transistors via a first node N1. In addition, respective first terminals of the plurality of transistors may be connected to corresponding bit lines BL0 through BLm−1 and respective second terminals of the plurality of transistors may be connected to the BL voltage generator 220. The bit line voltage controller 210 may control voltages of corresponding bit lines BL0 through BLm−1 depending on the BLSHF and corresponding bit line supply voltage.

The decoupling circuit 300 may be connected to the first node N1 and execute a decoupling operation for reducing a coupling effect on the memory cell array 100 and the page buffer 200. The decoupling circuit 300 may execute charge sharing for the first node N1 connected to the BLSHF generator 400 and the page buffer 200, and enhance sensing capability for memory cells MC0 through MCm−1 included in the memory cell array 100. Detailed descriptions thereof are provided with reference to FIG. 2.

The BLSHF generator 400 may generate and output the BLSHF to the page buffer 200. The BLSHF may have a voltage level independent of deviation in a power voltage provided to the non-volatile memory device 1 from the outside. The BLSHF generator 400 may include a circuit. The BLSHF generator 400 may receive voltages having a constant magnitude that are output from a voltage generator (not shown), etc. included in the non-volatile memory device 1. The BLSF generator 400 may determine the voltage level of the BLSHF depending on voltages having a constant magnitude supplied from the voltage generator (not shown) and output the determined BLSHF.

The control logic 500 may output various control signals for controlling the BLSHF generator 400 and the row decoder 600 such that a read operation can be executed in response to a command CMD.

The row decoder 600 may select any one of memory blocks of the memory cell array 100 in response to an address ADDR. The row decoder 600 may select any one of the word lines WLs of the selected memory block. The row decoder 600 may transfer a word line voltage from the voltage generator (not shown) to the word line WL of the selected memory block.

Figure 2:
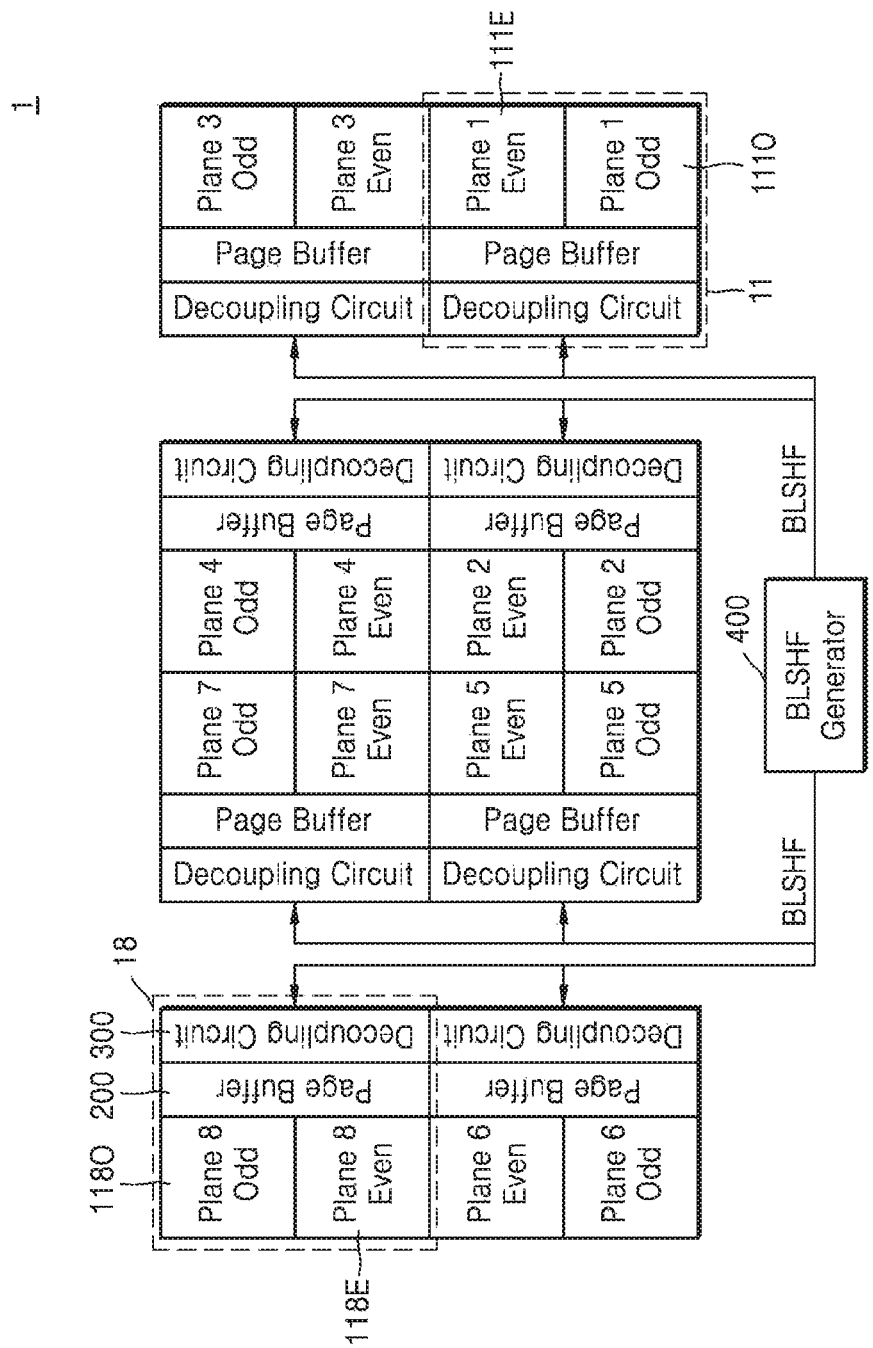
FIG. 2 is a block diagram of a non-volatile memory device according to some example embodiments of inventive concepts.

FIG. 2 is a block diagram of the non-volatile memory device 1 according to some example embodiments of inventive concepts. While FIG. 1 is a block diagram simultaneously illustrating various elements connected to the non-volatile memory device 1, FIG. 2 may be a block diagram illustrating connection relationships between a plurality of planes 111O, 111E, 118O, and 118E, the page buffer 200, the decoupling circuit 300, and the BLSHF generator 400 which are included in the memory cell array 100 of FIG. 1. Descriptions of content overlapping with content in FIG. 1 will be omitted.

Referring to FIGS. 1 and 2, the memory cell array 100 may include a plurality of planes 111O, 111E, 118O, and 118E. In FIG. 2, the plurality of planes 111O, 111E, 118O, and 118E are illustrated as including 16 elements. However, example embodiments are not limited thereto. The plurality of planes 111O, 111E, 118O, and 118E may include a plurality of odd planes 111O and 118O and a plurality of even planes 111E and 1118E, and the plurality of odd planes 111O and 118O and the plurality of even planes 111E and 118E may be respectively connected to the page buffer 200 and the decoupling circuit 300.

Plane groups, for example, first and eighth plane groups 11 and 18, may respectively include odd planes 111O and 118O and even planes 111E and 118E, and the page buffer 200 and the decoupling circuit 300 may be respectively connected thereto. The first plane group 11 may be physically placed close to the BLSHF generator 400, while the eighth plane group 18 may be physically placed far from the BLSHF generator 400. A difference may occur in physical distance between the BLSHF generator 400 and each of the plane groups. In this case, a sensing deviation may occur in each of the plane groups and a sensing time may be long. According to some example embodiments of inventive concepts, the sensing variation may be reduced by the charge sharing of the decoupling circuit 300 and a bit line sensing may be faster. Accordingly, performance of the non-volatile memory device 1 may be enhanced.

Hereinafter in this specification, plane groups that are physically relatively close to the BLSHF generator 400 (for example, the first plane group 11) may be denoted as nearby plane groups and plane groups that are physically relatively far from the BLSHF generator 400 (for example, the eighth plane group 18) may be denoted as distant plane groups.

Figure 3:
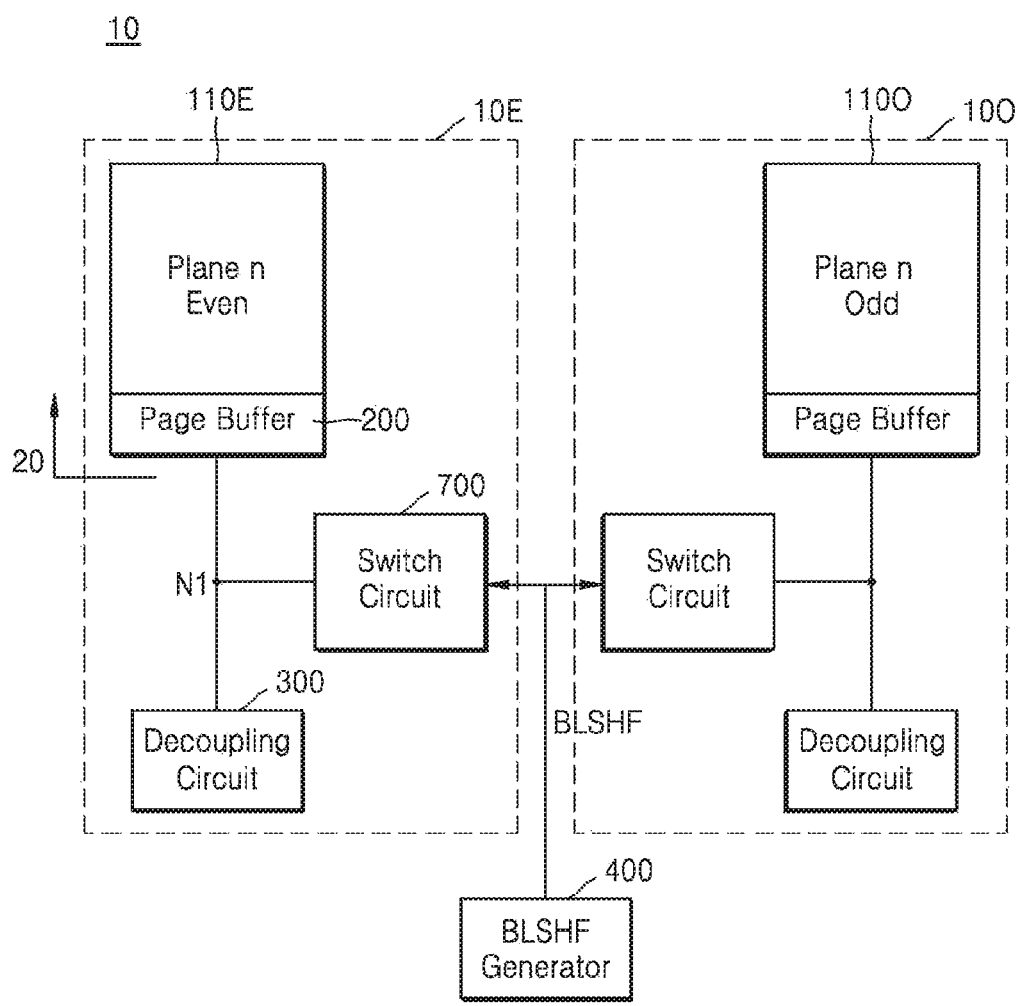
FIG. 3 is a block diagram of plane groups and a bit line voltage control signal generator according to some example embodiments of inventive concepts.

FIG. 3 is a block diagram of plane groups and the BLSHF generator 400 according to some example embodiments of inventive concepts. Descriptions of content overlapping with content in FIG. 2 will be omitted.

Referring to FIG. 3, a plane group 10 may include an odd plane group 10O and an even plane group 10E. The odd plane group 10O may include an odd plane 110O, the page buffer 200, the decoupling circuit 300, and a switch circuit 700. The even plane group 10E may include an even plane 110E, the page buffer 200, the decoupling circuit 300, and the switch circuit 700. Since all elements of the odd and even plane groups 10O and 10E are same except corresponding planes, descriptions will be provided with the even plane group 10E as a basis.

The even plane 110E may be connected to the page buffer 200, and the page buffer 200 may be connected to the decoupling circuit 300 and the switch circuit 700 via the first node N1. As described above in FIG. 1, the bit line voltage controller 210 included in the page buffer 200 may be connected to the first node N1 and control a voltage applied to the bit line BL. The first node N1 may be connected to gate terminals of one transistor or more which are included in the bit line voltage controller 210. The bit line voltage controller 210 may control the voltage applied to the bit line in accordance with the BLSHF applied from the first node N1. As described above, the described content may be applied to the odd plane group 10O.

The switch circuit 700 may be connected to the first node N1 and control an application of the BLSHF to the page buffer 200. The switch circuit 700 will be described in detail in FIG. 9.

Figure 4:
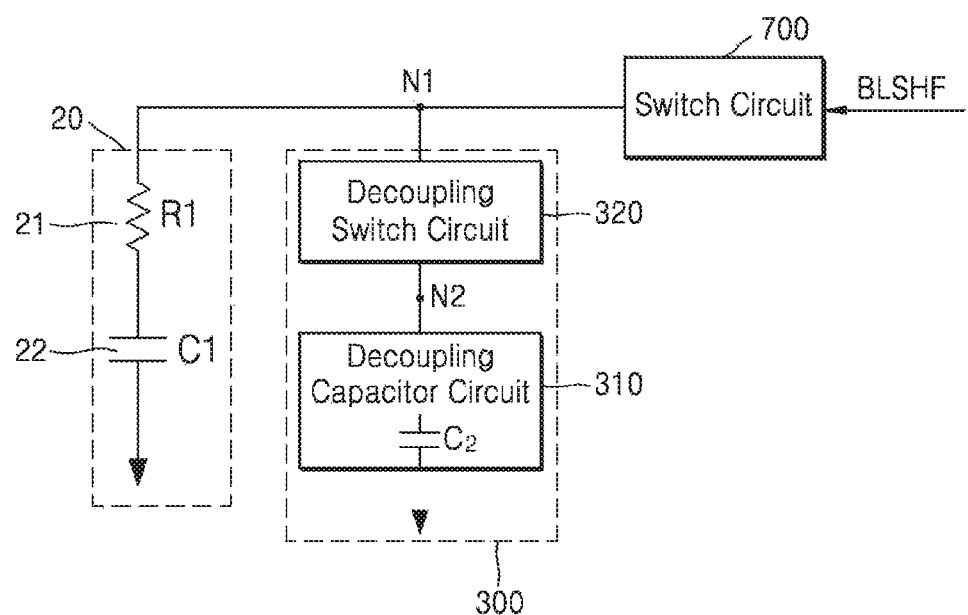
FIG. 4 is a circuit diagram of a plane group according to some example embodiments of inventive concepts.

FIG. 4 is a circuit diagram of a plane group according to some example embodiments of inventive concepts. Descriptions of content overlapping with content in FIG. 3 will be omitted.

Referring to FIGS. 3 and 4, a plane equivalent circuit 20 may be a Thevinin equivalent circuit for a circuit seen upward from the first node N1 in FIG. 3. In other words, the plane equivalent circuit 20 may be an equivalent circuit, for the even plane 110E (or the odd plane 110O) and the page buffer 200 connected thereto, seen from the first node N1. The plane equivalent circuit 20 may include a plane equivalent resistor 21 having a first resistance R1 and a plane equivalent capacitor 22 having a first capacitance C1.

The decoupling circuit 300 may include a decoupling capacitor circuit 310 and a decoupling switch circuit 320. The decoupling capacitor circuit 310 may include at least one decoupling capacitor, may be charged at a constant voltage, and may execute the charge sharing via the first node N1. In addition, the decoupling capacitor circuit 310 may include at least one decoupling capacitor having a second capacitance C2. According to some example embodiments of inventive concepts, the second capacitance C2 may satisfy the formula, C1/(C1+C2)×V_PRE=V_DEV, in order to maintain a develop voltage V_DEV after the charge sharing for the first node N1 in a sensing process with respect to a precharge voltage V_PRE, the develop voltage V_DEV, and the first capacitance C1. In other words, the second capacitance C2 may satisfy a formula, C2=C1×(V_PRE/V_DEV−1). Descriptions thereof are provided in detail below with reference to FIGS. 12A through 13B. The decoupling switch circuit 320 may include various switches controlling the decoupling capacitor circuit 310 and descriptions of this issue will be provided later in FIG. 10.

Figure 5:
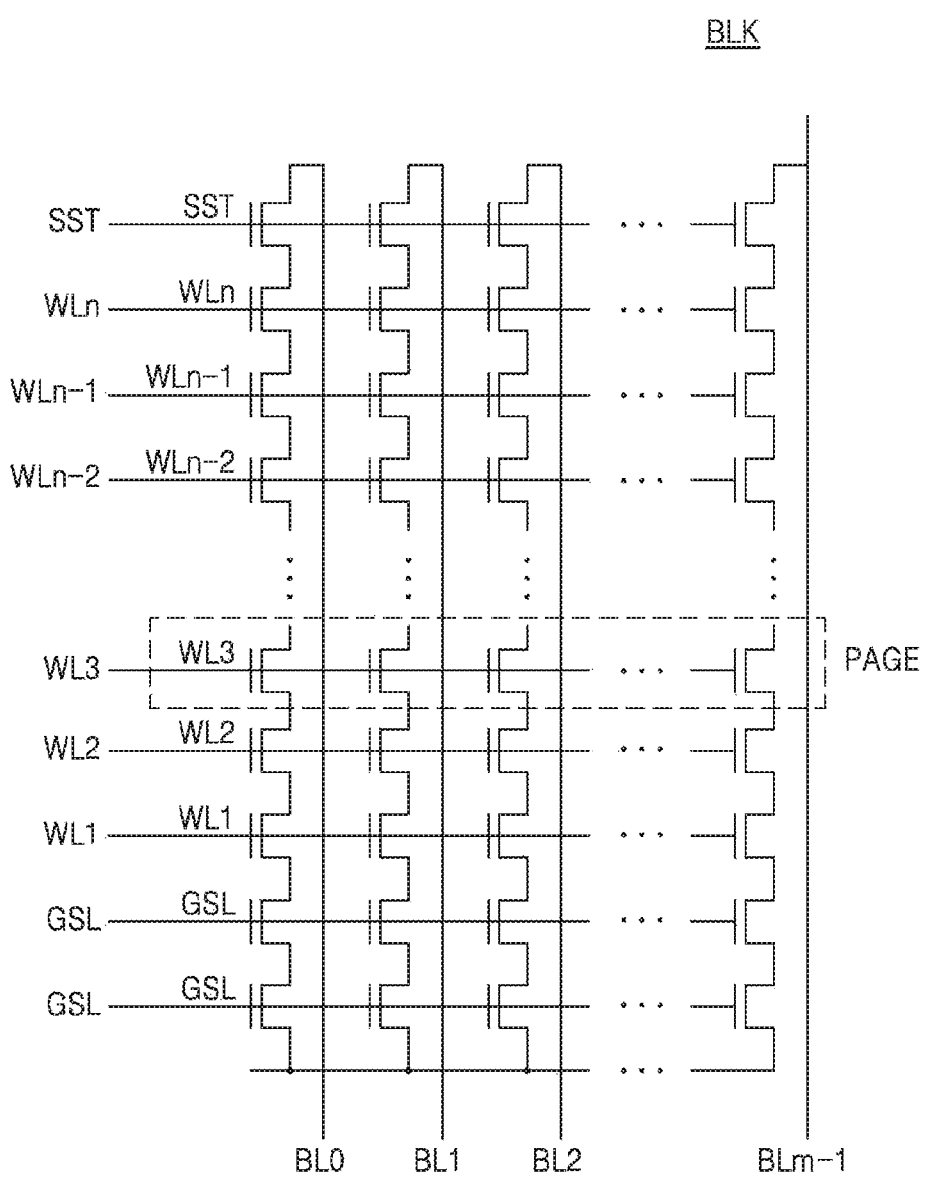
FIG. 5 is a circuit diagram of a memory block according to some example embodiments of inventive concepts.

FIG. 5 is a circuit diagram of a memory block BLK according to some example embodiments of inventive concepts.

Referring to FIG. 5, a memory cell array (for example, 100 in FIG. 1) may be a memory cell array of a horizontal NAND flash memory and may include a plurality of memory blocks BLKs. Each of memory blocks BLKs may include a plurality of pages PAGEs including m of memory cells MCs in a direction perpendicular to each of bit lines BL0 through BLm−1.

A NAND flash memory device having a structure as illustrated in FIG. 5 may execute an erase operation on a block basis and execute a program on a page basis corresponding to each of word lines WL0 through WL7. FIG. 5 illustrates an example in which eight pages PAGEs are included for eight word lines WL0 through WL7 in each block. However, memory blocks BLKs of the memory cell array 100 may include different numbers of memory cells MCs and pages PAGEs from those illustrated in FIG. 5, according to some example embodiments of inventive concepts. In addition, the non-volatile memory device in FIGS. 1 through 4 may include a plurality of memory cell arrays which execute identical operations with an identical structure as the previously-described memory cell array 100.

Figure 6:
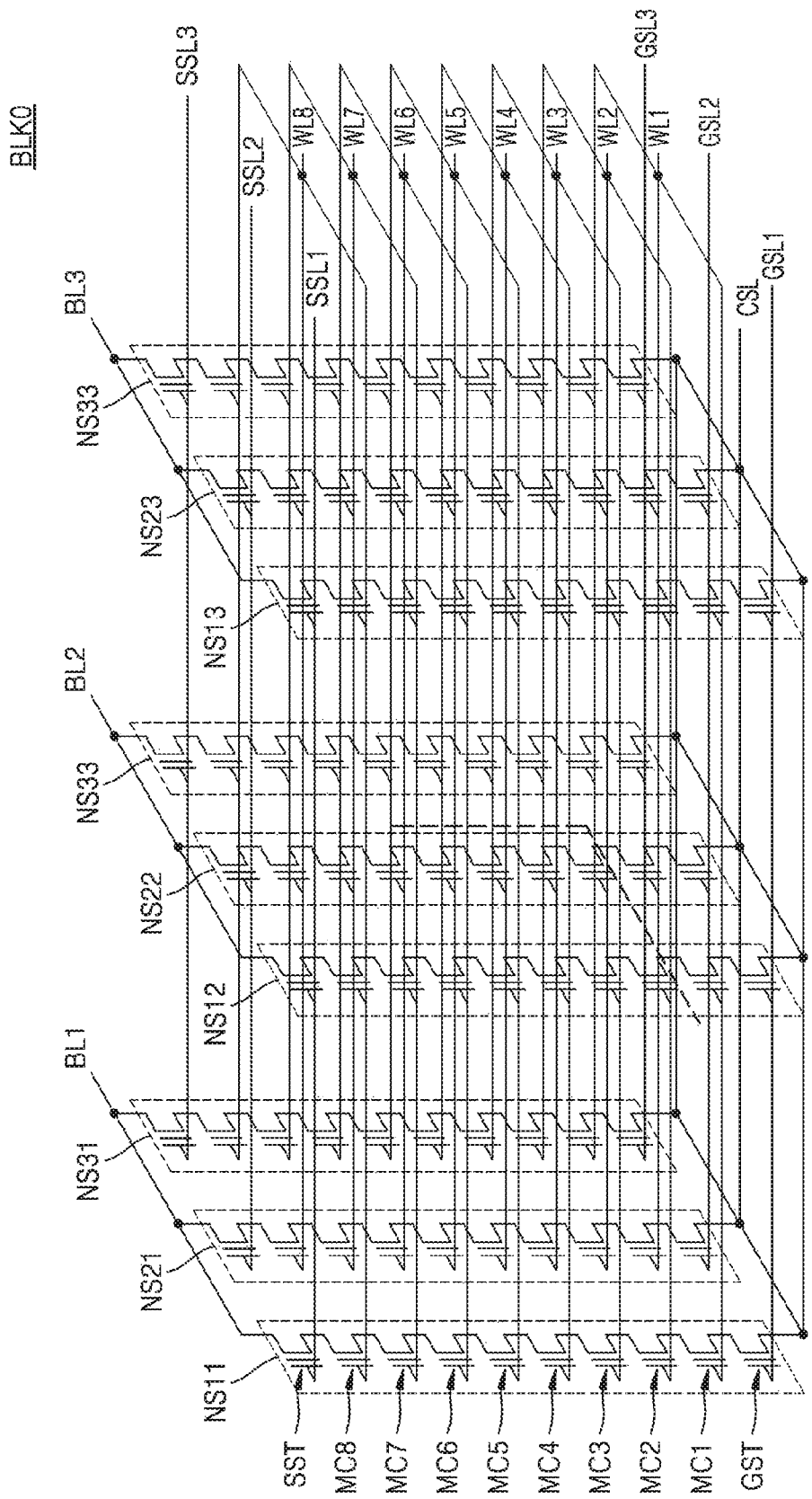
FIG. 6 is a circuit diagram of another example of a memory block included in a memory cell array according to some example embodiments of inventive concepts.

FIG. 6 is a circuit diagram of another example of a memory block BLK0 included in a memory cell array according to some example embodiments of inventive concepts.

Referring to FIG. 6, a memory cell array (for example, 100 in FIG. 1) may be a memory cell array of a vertical NAND flash memory and may include a plurality of memory blocks BLK0s. Each memory block BLK0 may include a plurality of NAND strings NS11 through NS33, a plurality of word lines WL1 through WL8, a plurality of bit lines BL1 through BL3, a plurality of ground select lines GSL1 through GSL3, a plurality of string select lines SSL1 through SSL3, and a common source line CSL. The numbers of NAND strings, word lines WLs, bit lines, ground select lines and string select lines may be adjusted.

NAND strings NS11, NS21, and NS31 may be arranged between the first bit line BL1 and the common source line CSL. NAND strings NS12, NS22, and NS32 may be arranged between the second bit line BL2 and the common source line CSL. NAND strings NS13, NS23, and NS33 may be arranged between a third bit line BL3 and the common source line CSL. Each of NAND strings (for example, NS11) may include the string select transistor SST, the plurality of memory cells MC1 through MC8 and a ground select transistor GST which are connected in series.

Strings commonly connected to one bit line may form one column. For example, strings NS11, NS21, and NS31 commonly connected to the first bit line BL1 may correspond to a first column, strings NS12, NS22, and NS32 commonly connected to the second bit line BL2 may correspond to a second column, and strings NS13, NS23, and NS33 commonly connected to the third bit line BL3 may correspond to a third column.

Strings connected to one string select line may form a row. For example, strings NS11, NS12, and NS13 connected to the first string select line SSL1 may correspond to a first row, strings NS21, NS22, and NS23 connected to the second string select line SSL2 may correspond to a second row, and strings NS31, NS32, and NS33 connected to the third string select line SSL3 may correspond to a third row.

The string selection transistor SST may be connected to corresponding string selection lines SSL1 through SSL3. Each of the plurality of memory cells MC1 through MC8 may be connected to corresponding word lines WL1 through WL8. The ground select transistor GST may be connected to corresponding ground select lines GSL1 through GSL3. The string select transistor SST may be connected to corresponding bit lines BL1 through BL3 and the ground select transistor GST may be connected to the common source line CSL.

Word lines WLs on the same level (for example, WL1) may be commonly connected to each other, while string select lines SSL1 through SSL3 may be spaced apart from each other and ground selection lines GSL1 through GSL3 may be spaced apart from each other. For example, when memory cells which are connected to the first word line WL1 and belong to strings NS11, NS12, and NS13 are programmed, the first word line WL1 and the first string selection line SSL1 may be selected. The ground selection lines GSL1 through GSL3 may be commonly connected to each other.

Figure 7:
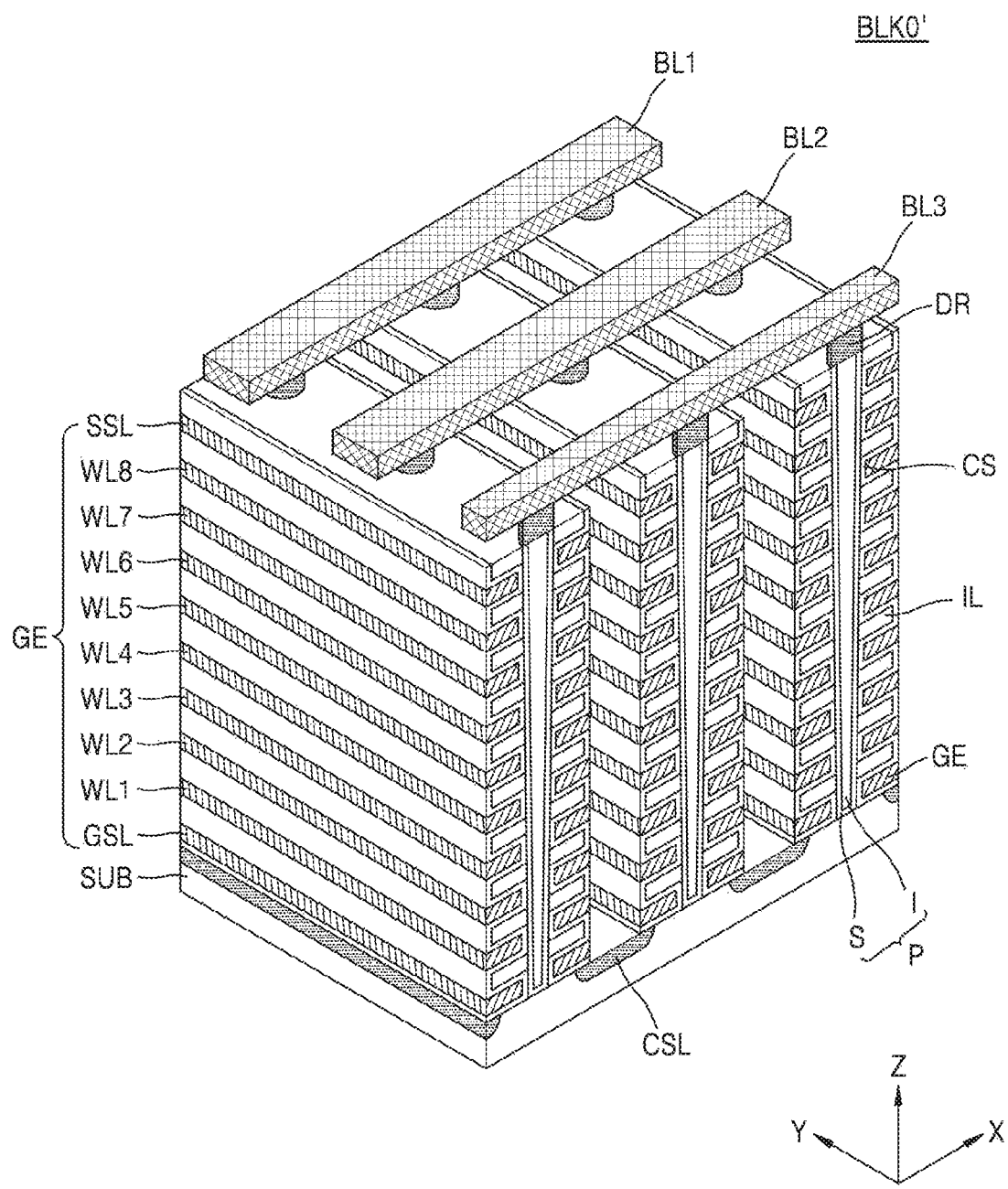
FIG. 7 is a perspective view of an example of the memory block of FIG. 6.

FIG. 7 is a perspective view of a memory block BLK0' that is an example of the memory block BLK0 of FIG. 6.

Referring to FIG. 7, each memory block included in a memory cell array (for example, 100 in FIG. 1) may be formed in a vertical direction with respect to a substrate SUB. In FIG. 6, the memory block BLK0 is illustrated as including two selection lines GSL and SSL, eight word lines WL1 through WL8, and three bit lines BL1 through BL3, but the numbers may be actually more or less than these numbers.

The substrate SUB may include a first conductivity type (for example, a p-type), and the common source line CSL which is extended along a first direction (for example, a y-direction) thereon and a second conductivity type (for example, n-type) is doped thereon may be provided. A plurality of insulating layers ILs which are extended along the first direction may be sequentially provided on a region of the substrate SUB between two adjacent common source lines CSLs in a third direction (for example, a z-direction), and the plurality of insulating layers ILs may be separate from each other by a certain distance along the third direction. For example, the plurality of insulating layers ILs may include insulating material such as silicon oxide.

A plurality of pillars Ps may be formed which are sequentially arranged along the first direction on the region of the substrate SUB between two adjacent common source lines CSLs, and penetrate the plurality of insulating layers ILs along the third direction. For example, the plurality of pillars Ps may penetrate through the plurality of insulating layers ILs and contact the substrate SUB. In detail, a surface layer S of each pillar P may include silicon material of the first type, and may function as a channel region. An inner layer I of each pillar P may include insulating material such as silicon oxide or an air gap.

A charge storage layer CS may be provided along exposed surfaces of the insulating layers ILs, the pillars Ps, and the substrate SUB, in a region between two adjacent common source lines CSLs. The charge storage layer CS may include a gate insulating layer (or, "a tunneling insulating layer"), a charge trapping layer, and a blocking insulating layer. For example, the charge storage layer CS may have an oxide-nitride-oxide (ONO) structure. In addition, a gate electrode GE such as selection lines GSL and SSL, and word lines WL1 through WL8 may be provided on an exposed surface of the charge storage layer CS, in a region between two adjacent common source lines CSLs.

Drains or drain contacts DRs may be respectively provided on the plurality of the pillars Ps. For example, the drains DRs may include silicon material with impurities of the second conductivity type doped thereon. The bit lines BL1 through BL3 which are extended along the second direction (for example, the x-axis) and separate from each other by a certain distance along the first direction may be provided on the drains DRs.

Figure 8:
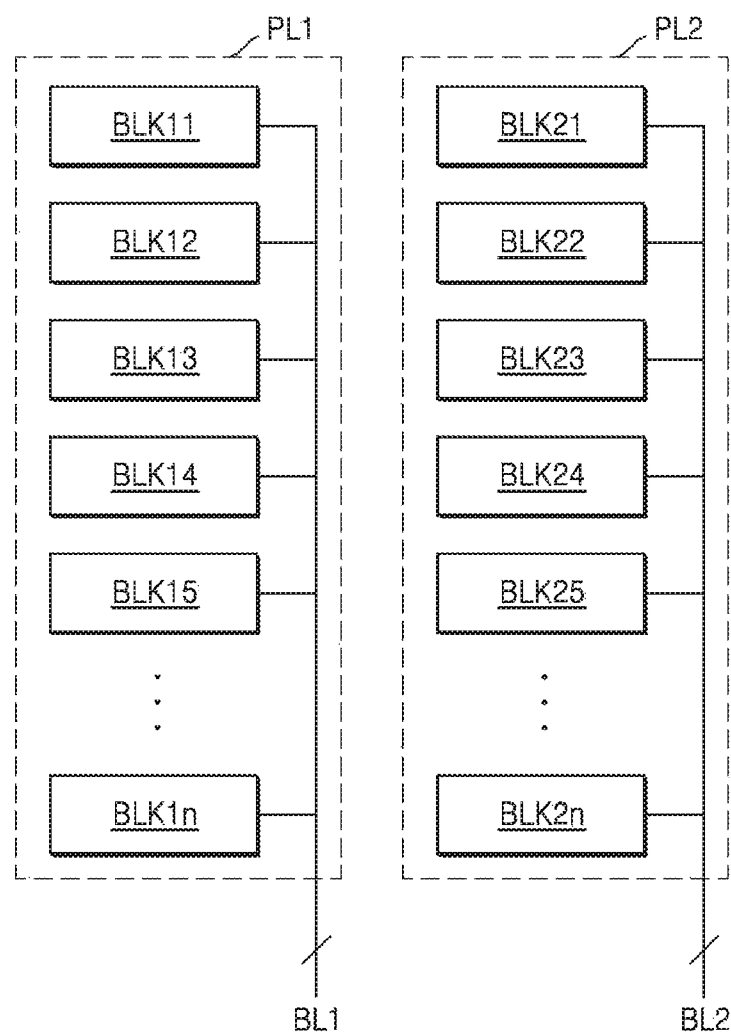
FIG. 8 is a block diagram of planes included in a memory cell array according to some example embodiments of inventive concepts.

FIG. 8 is a block diagram of planes included in the memory cell array 100 according to some example embodiments of inventive concepts.

Referring to FIGS. 1 and 8, each of planes PL1 and PL2 included in the memory cell array 100 may include the plurality of memory blocks BLKs connected to one bit line. The plurality of memory blocks BLKs may be memory blocks BLK, BLK0, and BLK0' described in FIGS. 5 through 7. In addition, planes PL1 and PL2 may include the plurality of pages PAGEs included in the plurality of memory blocks BLKs.

A plurality of memory blocks BLK11 through BLK1n, and BLK21 through BLK2n may be connected to the page buffer 200 via bit lines BL1 and BL2. For example, memory blocks BLK11 through BLK1n included in a first plane PL1 may be connected to the page buffer 200 via the first bit line BL1. Memory blocks BLK21 through BLK2n included in a second plane PL2 may be connected to the page buffer 200 via the second bit line BL2. In other words, memory blocks BLK11 through BLK1n included in the first plane PL1 may share the first bit line BL1, and memory blocks BLK21 through BLK2n included in the second plane PL2 may share the second bit line BL2. In FIG. 8, only two planes PL1 and PL2 are illustrated as examples. However, as described in FIG. 2, the number of planes (such as PL1 and PL2) may variably change.

Figure 9:
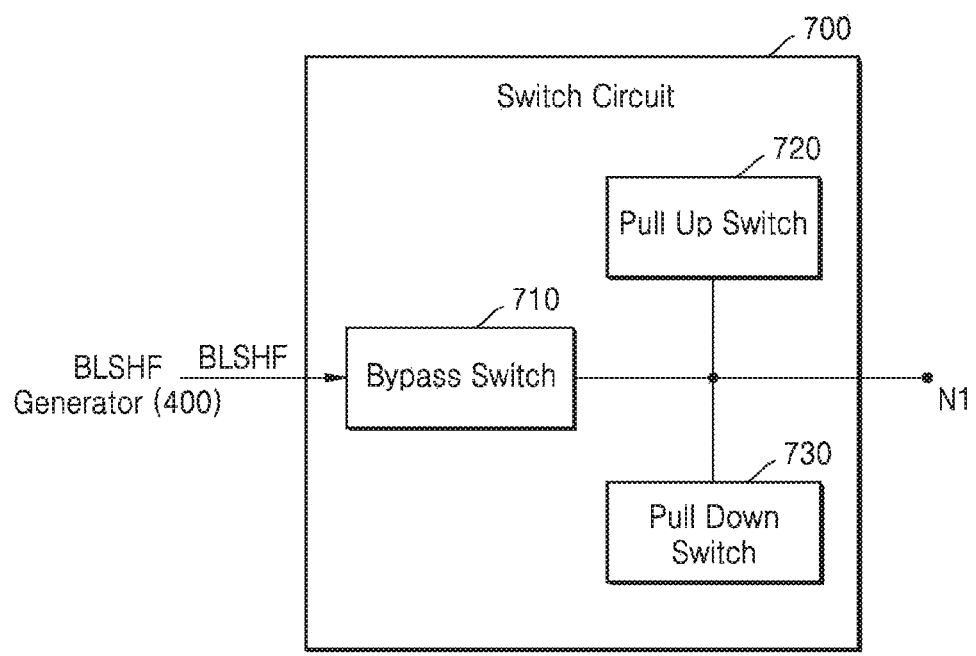
FIG. 9 is a block diagram of a switch circuit according to some example embodiments of inventive concepts.

FIG. 9 is a block diagram of the switch circuit 700 according to some example embodiments of inventive concepts.

Referring to FIGS. 4 and 9, the switch circuit 700 may include a by-pass switch 710, a pull-up switch 720, and a pull-down switch 730, and the by-pass switch 710, the pull-up switch 720, and the pull-down switch 730 may be connected to the first node N1. In addition, the by-pass switch 710, the pull-up switch 720, and the pull-down switch 730 may include at least one switching element (for example, a transistor).

The by-pass switch 710 may receive the BLSHF from the BLSHF generator 400 and apply the BLSHF to the page buffer 200 via the first node N1. The pull-up switch 720 may be connected to a power voltage VDD and the pull-down switch 730 may be connected to a ground voltage GND. When the BLSHF is not applied to the page buffer 200, the pull-up switch 720 and the pull-down switch 730 may have the first node N1 biased to the power voltage VDD or the ground voltage GND.

In FIG. 9, both the pull-up switch 720 and the pull-down switch 730 are illustrated. However, in some example embodiments, the switch circuit 700 may not include at least one of the pull-up switch 720 and the pull-down switch 730.

Figure 10:
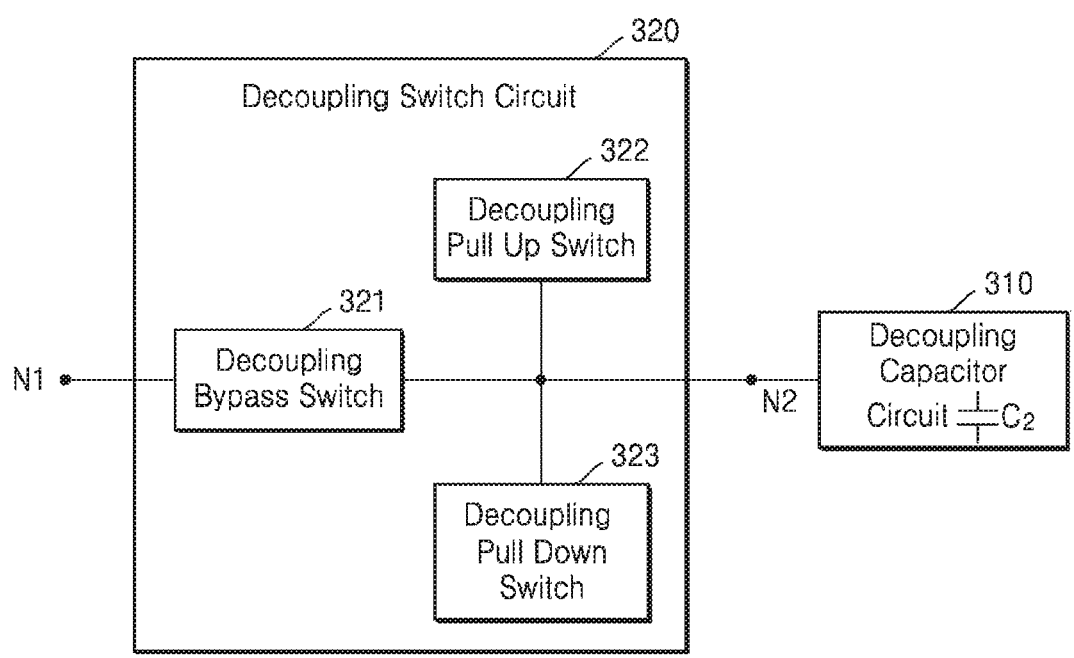
FIG. 10 is a block diagram of a decoupling switch circuit and a decoupling capacitor circuit according to some example embodiments of inventive concepts.

FIG. 10 is a block diagram of the decoupling switch circuit 320 and the decoupling capacitor circuit 310 according to some example embodiments of inventive concepts.

Referring to FIGS. 9 and 10, the decoupling switch circuit 320 may include a decoupling by-pass switch 321, a decoupling pull-up switch 322, and a decoupling pull-down switch 323, and the decoupling by-pass switch 321, the decoupling pull-up switch 322, and the decoupling pull-down switch 323 may be connected to the decoupling capacitor circuit 310 via the second node N2. In addition, the decoupling by-pass switch 321, the decoupling pull-up switch 322, and the decoupling pull-down switch 323 may include at least one switching element (for example, a transistor).

The decoupling by-pass switch 321 may switch a connection between the decoupling capacitor circuit 310 and the first node N1, and control the charge sharing of the decoupling capacitor circuit 310 for the first node N1. The decoupling pull-up switch 322 may be connected to the power voltage VDD. Accordingly, the decoupling pull-up switch 322 may charge the decoupling capacitor circuit 310 to the power voltage VDD. The decoupling pull-down switch 323 may be connected to the ground voltage GND. Accordingly, the decoupling pull-down switch 323 may discharge the decoupling capacitor circuit 310 to the ground voltage GND.

In FIG. 10, both the decoupling pull-up switch 322 and the decoupling pull-down switch 323 are illustrated. However, the decoupling switch circuit 320 may not include at least one of the decoupling pull-up switch 322 and the decoupling pull-down switch 323 according to some example embodiments of inventive concepts.

According to some example embodiments of inventive concepts, the decoupling capacitor circuit 310 may include at least one decoupling capacitor having a second capacitance C2. In addition, the capacitance of the decoupling capacitors may be the same or similar to each other per plane group.

Figure 11:
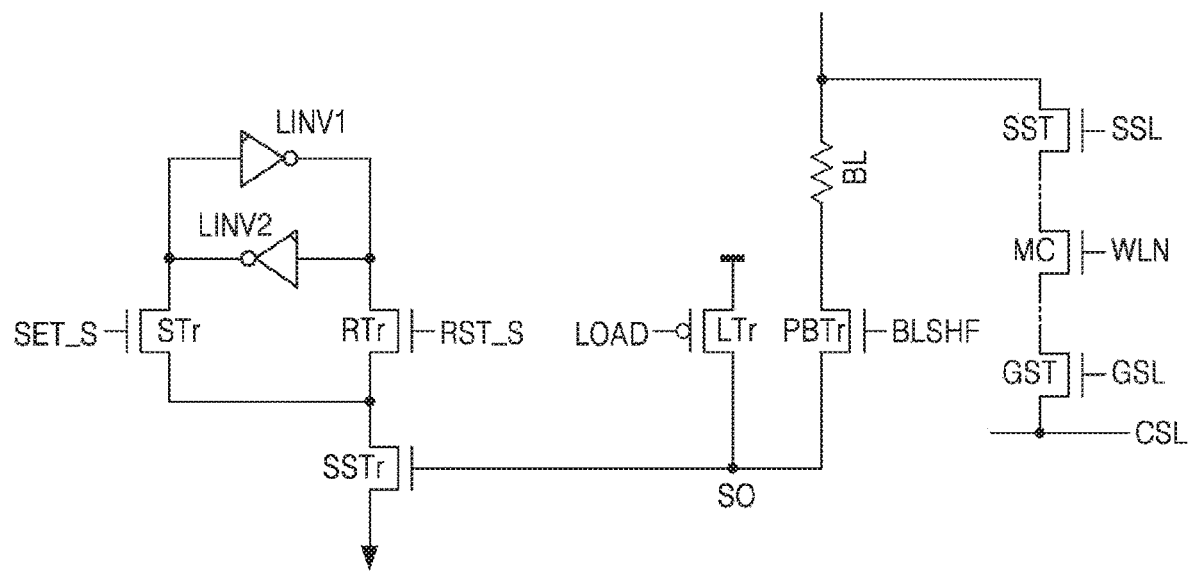
FIG. 11 is a circuit diagram of a portion of a non-volatile memory device according to some example embodiments of inventive concepts.

FIG. 11 is a circuit diagram of a portion of a non-volatile memory device 1 according to some example embodiments of inventive concepts.

Referring to FIG. 11, the non-volatile memory device 1 may include a page buffer transistor PBTr, a load transistor LTr, a set transistor STr, a reset transistor RTr, a sensing transistor SSTr, the string selection transistor SST, the plurality of memory cells MCs, the ground selection transistor GST, the bit line BL, and a sensing latch including a first latch inverter LINV1 and a second latch inverter LINV2. Since the string selection transistor SST, the plurality of memory cells MCs, and the ground selection transistor GST have been described in detail in FIG. 5, etc., descriptions thereof will be omitted. The bit line BL is illustrated as an equivalent resistor having self-resistance of wires, etc.

In the non-volatile memory device 1, a general sensing operation of a memory cell MC may include an initialize stage, a precharge stage, a bit line BL develop stage, an offset sensing node SO develop stage, and a sensing stage. In the initialize stage, a set signal SET_S may change to logic HIGH, the set transistor STr may be turned ON, and accordingly, the sensing latch may be initialized. In the precharge stage, the load transistor LTr may change to an ON state, the voltage level of the BLSHF may change to the precharge voltage V_PRE, and the bit line BL may be precharged to a level of the precharge voltage V_PRE.

In the bit line BL develop stage, the load transistor LTr may change to an OFF state, finish the precharge operation for the bit line BL, and the BLSHF may change to logic LOW (for example, 0V). In addition, the ground selection transistor GST may change to the ON state and the bit line BL may change to the develop stage by cell current due to the memory cell MC.

In the offset sensing node SO develop stage, the develop voltage V_DEV, which is lower than the precharge voltage V_PRE, may be applied as the BLSHF, and accordingly, when the memory cell MC is at the ON state, the voltage level of the bit line BL may be lower than the voltage level at the OFF state. In addition, in the sensing stage, the reset transistor signal RST_S may change to the ON state and subsequently, whether the memory cell MC is in the ON or OFF state may be sensed based on a flipped state of the sensing latch.

Figure 12A:
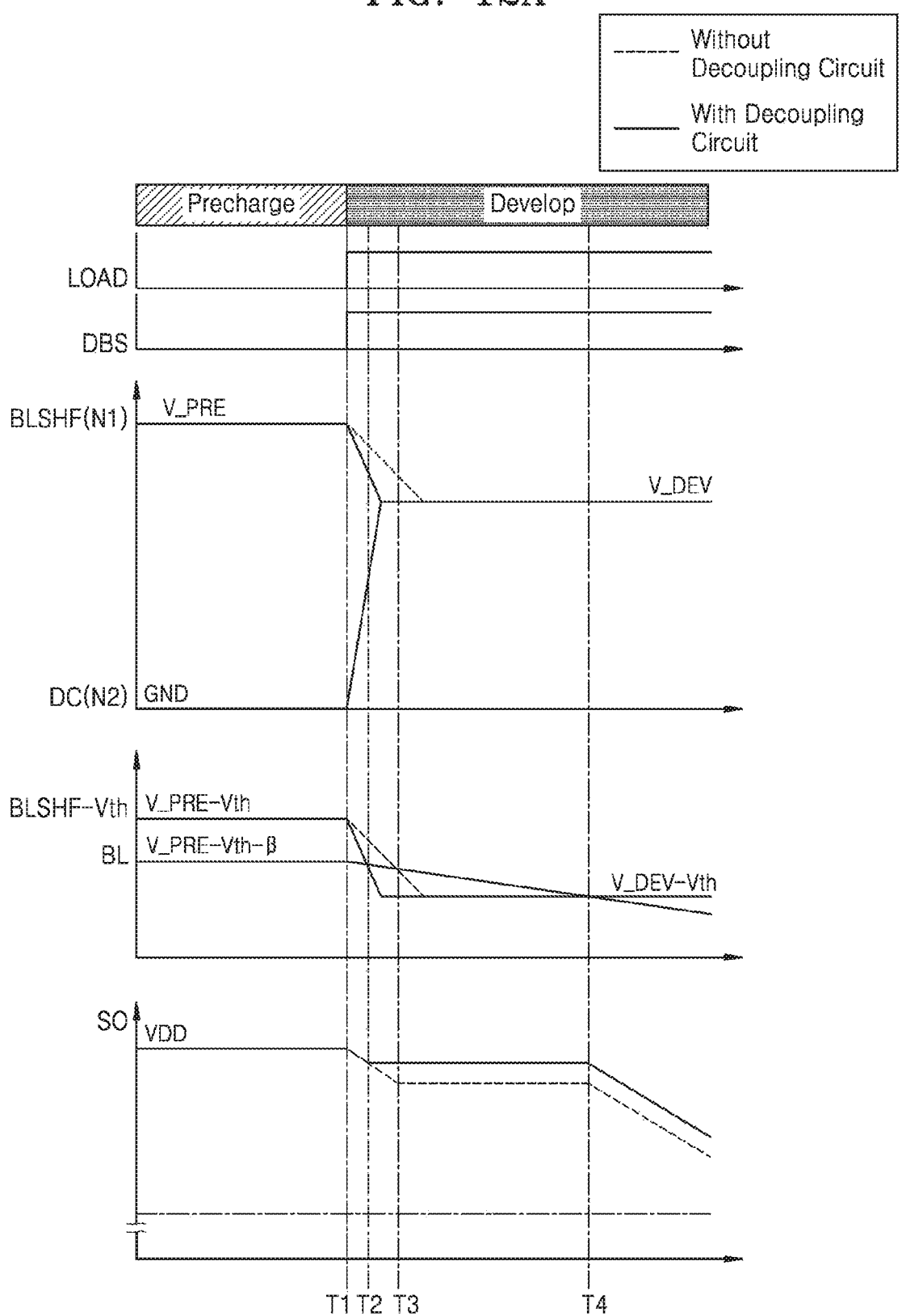
FIG. 12A is a timing diagram of a pre-charge stage and a develop stage of a plane group according to some example embodiments of inventive concepts.

FIG. 12A is a timing diagram of a pre-charge stage and a develop stage of a plane group according to some example embodiments of inventive concepts. FIG. 12A is the timing diagram illustrating the pre-charge stage and the develop stage when the memory cell MC of a nearby plane group is at the ON state. The develop stage may include the bit line BL develop stage described in FIG. 11 and the offset SO develop stage.

Referring to FIGS. 10, 11, and 12A, in the pre-charge stage, the decoupling capacitor DC included in the decoupling capacitor circuit 310 may be discharged to the ground voltage GND by the decoupling pull-down switch 323.

At a time T1, a load signal LOAD may change to logic HIGH and enter the bit line BL develop stage when the develop voltage V_DEV is applied to the BLSHF. In this case, the voltage level of the bit line BL may gradually decrease from V_PRE-Vth-β at the precharge stage. In FIG. 12A, V_PRE is the precharge voltage, Vth is a threshold voltage of the PBTr, and β is a voltage drop due to cell current.

The BLSHF may not immediately change from the pre-charge voltage V_PRE to the develop voltage V_DEV and thus, a transition time may occur. In this case, according to some example embodiments of inventive concepts, the decoupling capacitor DC may execute the charge sharing as shown in a solid line, and the plane group may change to the develop voltage V_DEV due to the charge sharing of the BLSHF generator (400 in FIG. 2) and the decoupling capacitor DC. Accordingly, the plane group may be more rapidly change to the develop voltage V_DEV than when the plane group is changed to the develop voltage V_DEV due to only the BLSHF (400 in FIG. 2) as illustrated in a dotted line.

The voltage level of the sensing node SO may maintain the power voltage VDD at the precharge stage and may gradually decrease after having entered the bit line BL develop stage. However, when the voltage level of the bit line BL becomes higher than a difference between the voltage level of the BLSHF and the threshold voltage Vth, that is, BLSHF-Vth (a time T2 through a time T3), the sensing node SO may maintain a voltage level thereof at the time T2. Accordingly, when the charge sharing is executed (the solid line) by the decoupling capacitor DC, a voltage drop time (T2-T1) of the sensing node SO may be shorter than a voltage drop time (T3-T1) of a case when the charge sharing is not executed (the dotted line), according to some example embodiments. As the voltage drop time is reduced, the sensing node SO may begin the offset sensing node SO develop stage at a relatively high voltage level according to some example embodiments.

Thereafter, when the voltage level of the bit line BL is lower than the difference between the voltage level of the BLSHF and the threshold voltage Vth, that is, BLSHF-Vth (at a time T4), the voltage level of the sensing node SO may gradually decrease again.

Figure 12B:
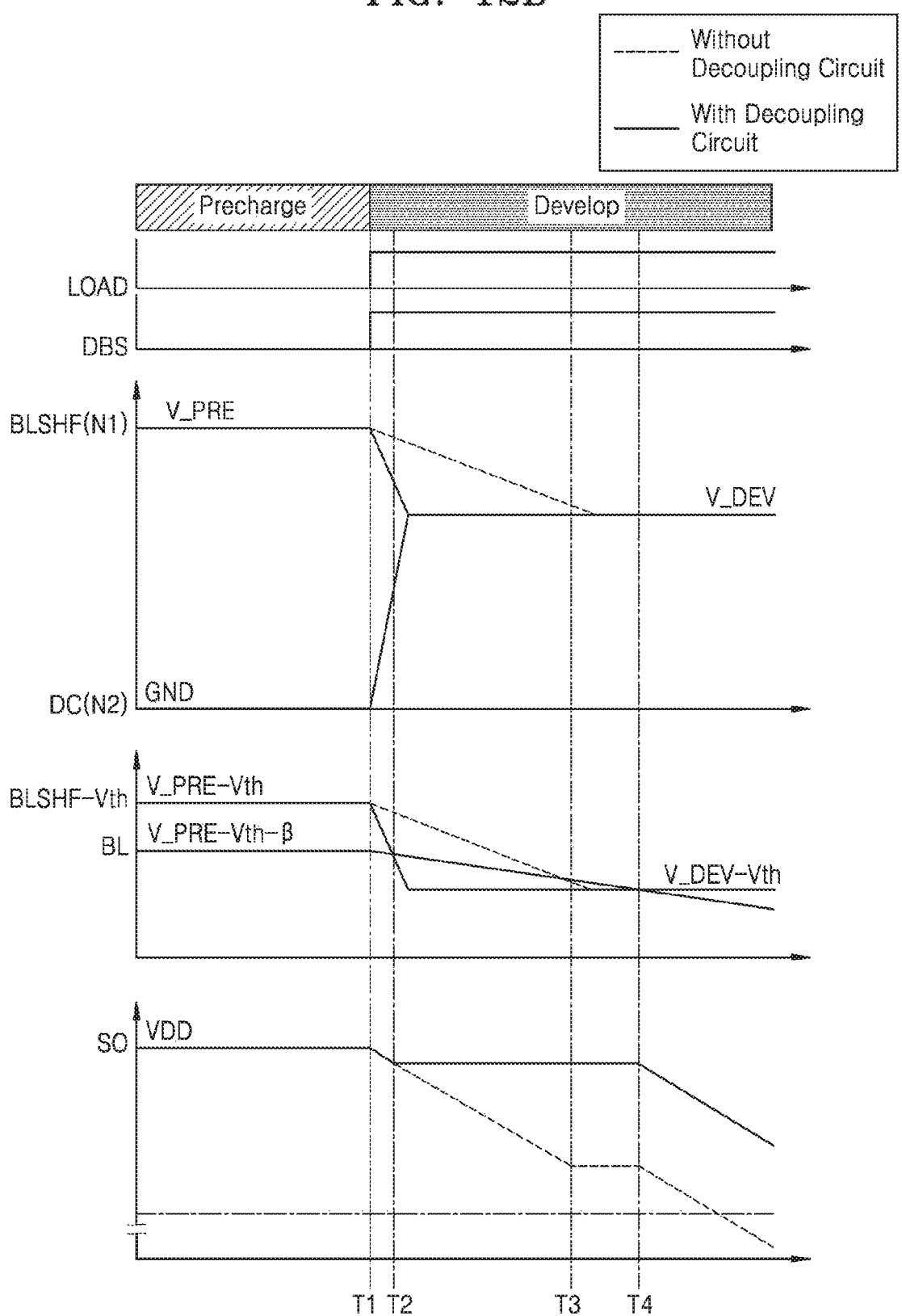
FIG. 12B is a timing diagram of a pre-charge stage and a develop stage of a plane group according to some example embodiments of inventive concepts.

FIG. 12B is a timing diagram of a pre-charge stage and a develop stage of a plane group according to some example embodiments of inventive concepts. In detail, FIG. 12B is the timing diagram of the precharge stage and the bit line BL develop stage when the memory cell MC of a distant plane group is at the ON state. Descriptions of content overlapping with content in FIG. 12A will be omitted.

When cases without the decoupling circuit 300 (dotted lines) in FIGS. 12A and 12B are compared with each other with reference to FIGS. 12A and 12B, a transition time (T3-T1) from the precharge voltage V_PRE to the develop voltage V_DEV of the distant plane group may longer than the transition time of the nearby plane group. Accordingly, a difference in voltage levels of the sensing node SO between planes may occur and the subsequent sensing variation between planes may cause a reduction in sensing capability.

According to some example embodiments, plane groups may respectively include the decoupling circuits 300 per plane group. Accordingly, regardless of the distance between plane groups and the BLSHF generator 400, a voltage transition time (T2-T1) may be maintained constant by the charge sharing of the decoupling circuit 300 and the sensing variation between planes may be enhanced. In addition, as described in FIG. 12A, as the voltage transition time becomes shorter, the sensing node SO may begin the offset SO develop stage at a relatively high voltage level according to some example embodiments.

Figure 13A:
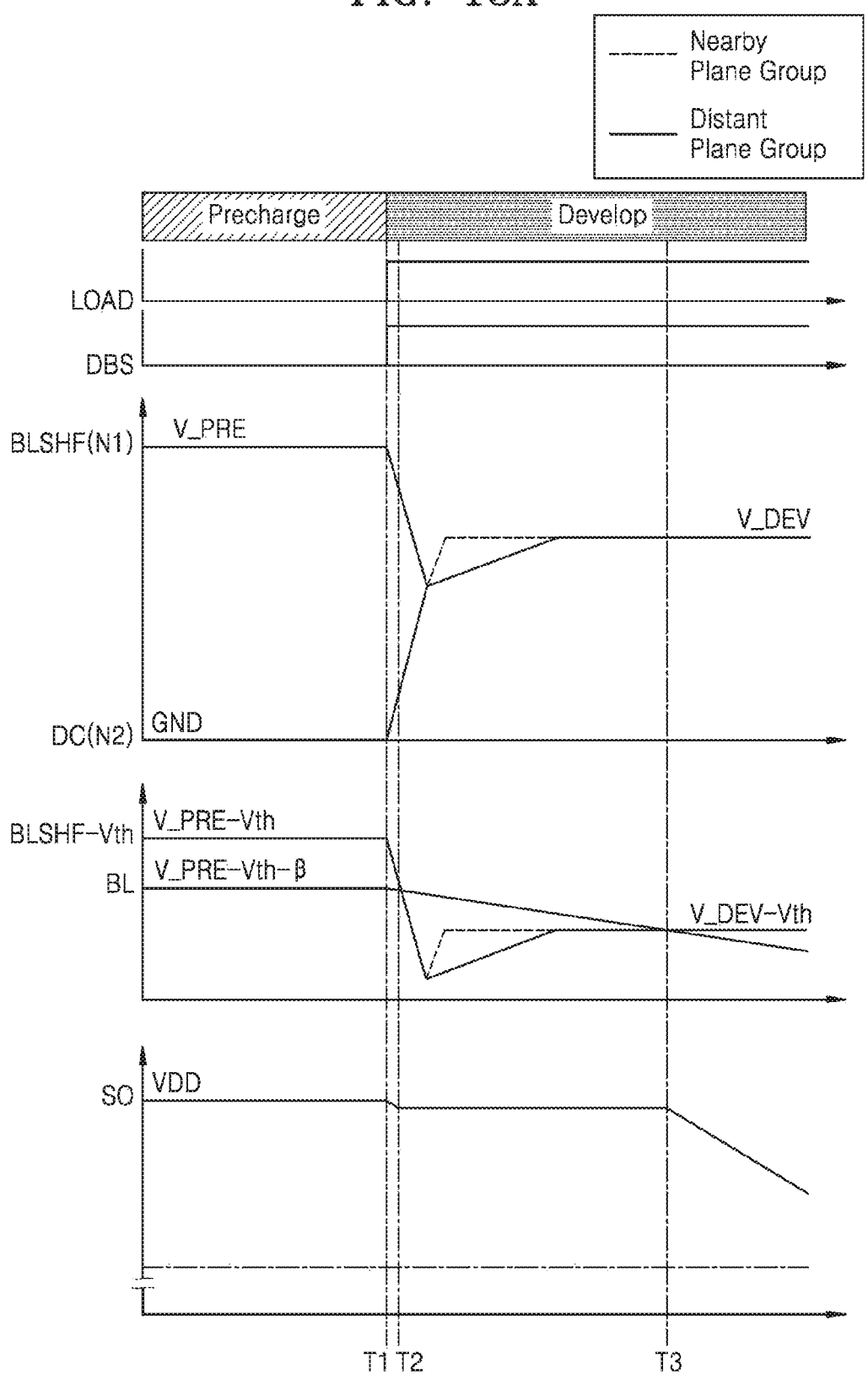
FIG. 13A is a timing diagram of a pre-charge stage and a develop stage of a plane group according to some example embodiments of inventive concepts.

FIG. 13A is a timing diagram of a pre-charge stage and a develop stage of a plane group according to some example embodiments of inventive concepts. In detail, FIG. 13A illustrates a case when the second capacitance C2 of the decoupling capacitor DC is set at a higher level than a target value. Descriptions of content overlapping with content in FIGS. 12A and 12B will be omitted.

Referring to FIGS. 4, 12A, 12B, and 13A, the second capacitance C2 of the decoupling capacitor DC may be set to satisfy an arithmetic formula, C2=C1×(V_PRE/V_DEV−1). In this case, the second capacitance C2 may be set to satisfy the arithmetic formula by estimating the first capacitance C1 of a plane equivalent capacitor in a manufacturing process. However, an estimated first capacitance C1$a$ may be more or less different from an actual first capacitance C1$b$. FIG. 13A may illustrate a case when the estimated first capacitance C1$a$ is greater than the actual first capacitance C1$b$. Accordingly, a second capacitance C2$a$ that is pre-set by the arithmetic formula may be greater than a targeted second capacitance C2$b$.

Solid lines in FIG. 13A may illustrate a case of a distant plane group and dotted lines may illustrate a case of a nearby plane group. Unlike shown in FIGS. 12A and 12B, the voltage levels of the BLSHF and the decoupling capacitor DC may be at voltage levels lower than the develop voltage V_DEV after the charge sharing. Thereafter, the voltage level of the BLSHF may be increased by the BLSHF generator 400 and thus, the distant plane group may reach the develop voltage V_DEV later than the nearby plane group. However, the time T2 when the voltage level of the bit line BL becomes higher than the difference between the BLSHF and the threshold voltage Vth (BLSHF) is the same as the time T3 when the voltage level of the bit line BL becomes lower than the difference between the BLSHF and the threshold voltage Vth (BLSHF) for the nearby plane group and the distant plane group, and thus, the sensing variation between planes may hardly occur.

Figure 13B:
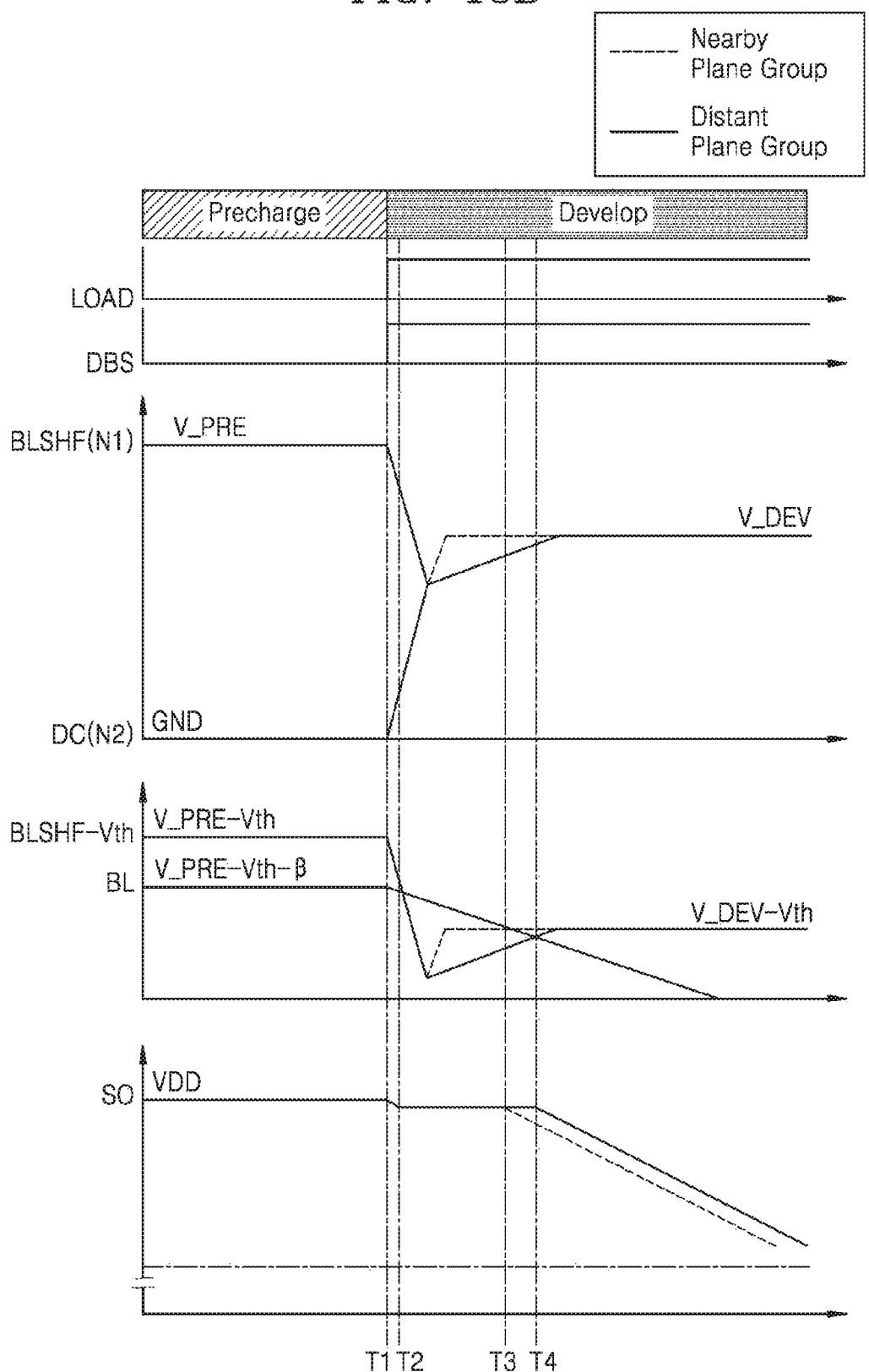
FIG. 13B is a timing diagram of a pre-charge stage and a develop stage of a plane group according to some example embodiments of inventive concepts.

FIG. 13B is a timing diagram of a pre-charge stage and a develop stage of a plane group according to some example embodiments of inventive concepts. In detail, FIG. 13A illustrates a case when the second capacitance C2 of the decoupling capacitor DC is set at a higher level than a target value and the cell current of the memory cell MC is large. Descriptions of content overlapping with content in FIGS. 12A and 13A will be omitted.

Referring to FIGS. 13A and 13B, since the cell current of the memory cell MC connected to the bit line BL in FIG. 13B is so large, a slope of the voltage level of the bit line BL after the time T1 may be steeper than that in FIG. 13A. Accordingly, the sensing node SO may begin a voltage drop at the time T3 for the case of the dotted line or the nearby plane group and at the time T4 for the case of the solid line or the distant plane group. However, there is still no difference in the voltage level of the sensing node SO at the time T2 for both cases and thus, the sensing variation may be enhanced.

Figure 14:
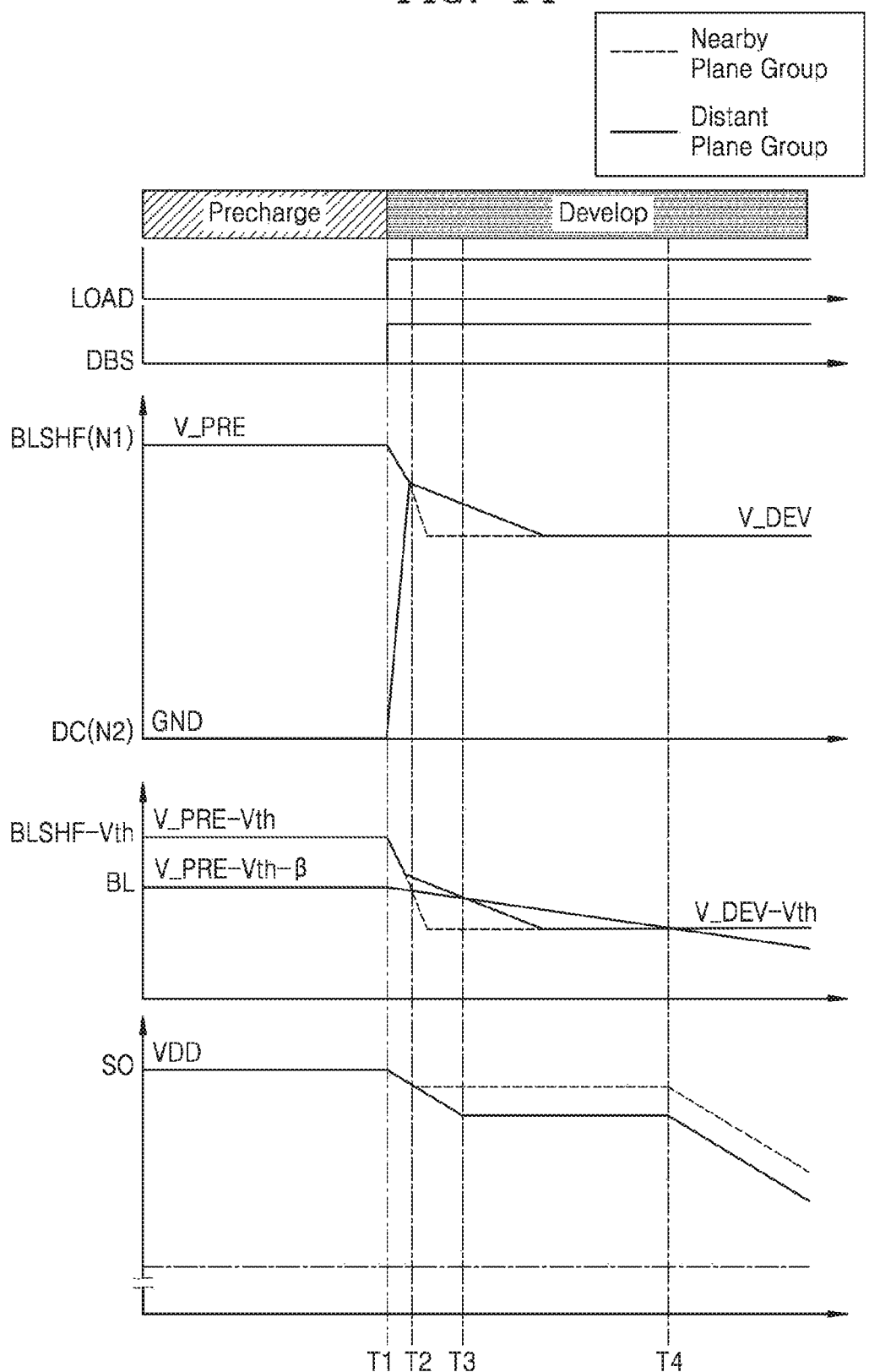
FIG. 14 is a timing diagram of a pre-charge stage and a develop stage of a plane group according to some example embodiments of inventive concepts.

FIG. 14 is a timing diagram of a pre-charge stage and a develop stage of a plane group according to some example embodiments of inventive concepts. In detail, FIG. 14 illustrates a case when the second capacitance C2 of the decoupling capacitor DC is set at a lower level than a target value. Descriptions of content overlapping with content in FIGS. 12A and 13B will be omitted.

Referring to FIGS. 4, 13A, and 14, the second capacitance C2 of the decoupling capacitor DC may be set to satisfy the arithmetic formula, C2=C1×(V_PRE/V_DEV−1). In this case, the second capacitance C2 may be set to satisfy the arithmetic formula by estimating the first capacitance C1 of a plane equivalent capacitor in a manufacturing process. However, the estimated first capacitance C1$a$ may be more or less different from the actual first capacitance C1$b$. FIG. 13A may illustrate a case when the estimated first capacitance C1$a$ is less than the actual first capacitance C1$b$. Accordingly, a second capacitance C2$a$ that is pre-set by the arithmetic formula may be less than a targeted second capacitance C2$b$.

Solid lines in FIG. 14 may illustrate a case of a distant plane group and dotted lines may illustrate a case of a nearby plane group. Unlike shown in FIGS. 13A and 13B, the voltage levels of the BLSHF and the decoupling capacitor DC may be at voltage levels higher than the develop voltage V_DEV after the charge sharing. Thereafter, the voltage level of the BLSHF may be decreased by the BLSHF generator 400 and thus, the distant plane group may reach the develop voltage V_DEV later than the nearby plane group. However, the times T2 and T3 when the voltage level of the bit line BL becomes higher than the difference between the BLSHF and the threshold voltage Vth (BLSHF) may be different. Accordingly, the distant plane group and the nearby plane group may maintain the voltage level of the sensing node SO at different points from each other. However, the time T4 when the sensing node SO begins the voltage drop again is same for both the distant and nearby plane groups and thus, the sensing variation may still be enhanced.

Figure 15:
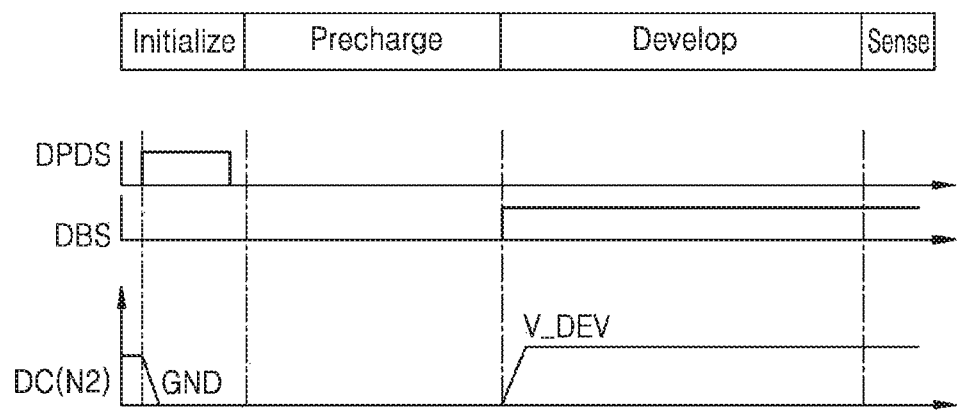
FIG. 15 is a timing diagram of an operation of a decoupling circuit according to some example embodiments of inventive concepts.

FIG. 15 is a timing diagram of an operation of a decoupling circuit according to some example embodiments of inventive concepts. Descriptions of content overlapping with content in FIG. 10 will be omitted.

Referring to FIGS. 9, 10, and 15, a decoupling pull-down switch DPDS may transit to logic HIGH at an initialize stage. Accordingly, the decoupling capacitor DC may be discharged to the ground voltage GND. A decoupling by-pass switch DBS may transit to logic HIGH at the develop stage and accordingly, the voltage level of the decoupling capacitor DC may change to the develop voltage V_DEV by the charge sharing.

In some example embodiments of inventive concepts, the decoupling switch circuit 320 may not include the decoupling pull-down switch 323. In this case, the decoupling capacitor DC may be discharged to the ground voltage GND as the decoupling by-pass switch 321 and the pull-down switch 730 included in the switch circuit 700 are simultaneously transited to logic HIGH.

FIG. 16A is a timing diagram of an initializing stage and a pre-charge stage of a plane group according to some example embodiments of inventive concepts.

Referring to FIGS. 4, 10, and 16A, a decoupling pull-up switch DPUS may change to logic HIGH at an initialize stage. Accordingly, the decoupling capacitor DC may be charged to the power voltage VDD. At the time T1, the precharge stage may start, the decoupling by-pass switch DBS may change to logic HIGH, and the decoupling capacitor DC may execute the charge sharing. The voltage level of the BLSHF may change from the ground voltage GND to the precharge voltage V_PRE by the charge sharing much faster than when the voltage level of the BLSHF is changed to the precharge voltage V_PRE by the BLSHF generator 400.

According to some example embodiments of inventive concepts, a third capacitance C3 may be set to satisfy a formula, $C1/(C1+C3) \times VDD = V\_PRE$, in order to maintain the precharge voltage V_PRE after the charge sharing for the first node N1 in a sensing process with respect to a precharge voltage V_PRE, the first capacitance C1 of the plane equivalent capacitor 22, and the power voltage VDD. In other words, the third capacitance C3 may satisfy a formula, $C3 = C1 \times (VDD/V\_PRE - 1)$.

At the time T2 when the voltage level of the BLSHF increases over the threshold voltage Vth of the page buffer transistor PBTr, the voltage level of the bit line BL may begin to increase. According to some example embodiments of inventive concepts, since plane groups respectively include decoupling circuits and each decoupling circuit execute the charge sharing, the time T3 when the voltage level of the BLSHF reaches the precharge voltage V_PRE and the time T4 when the voltage level of the bit line BL reaches the target value of $V\_PRE - Vth - \alpha$ may not be different from each other between the distant plane group and the nearby plane group. $\alpha$ is a voltage drop due to cell current.

In FIGS. 12A through 15, the decoupling capacitor DC is discharged to the ground voltage GND according to some example embodiments of inventive concepts. In FIG. 16, the decoupling capacitor DC is charged to the power voltage VDD according to some example embodiments of inventive concept. However, both the examples in FIGS. 12A through 15 and the example in FIG. 16 may be separately or simultaneously realized. In some example embodiments, the decoupling capacitor DC may be charged to the power voltage VDD by the decoupling pull-up switch DPUS at the initialize stage and may execute the charge sharing to the precharge voltage V_PRE at the precharge stage. Thereafter, the decoupling capacitor DC may be discharged to the ground voltage GND by the decoupling pull-down switch DPDS at the precharge stage, and may execute the charge sharing to the develop voltage V_DEV at the develop stage.

FIG. 16B is a timing diagram of an initializing stage and a pre-charge stage of a plane group according to some example embodiments of inventive concepts. In detail, FIG. 16B illustrates a case when the third capacitance C3 of the decoupling capacitor DC is set to be greater than a target value. Descriptions of content overlapping with content in FIG. 16A will be omitted.

Referring to FIGS. 4, 16A, and 16B, the third capacitance C3 may satisfy a formula, $C3 = C1 \times (VDD/V\_PRE - 1)$. In this case, the third capacitance C3 may be set to satisfy the arithmetic formula by estimating the first capacitance C1 of the plane equivalent capacitor in a manufacturing process. However, the estimated first capacitance C1a may be more or less different from the actual first capacitance C1b. FIG. 16A may illustrate a case when the estimated first capacitance C1a is greater than the actual first capacitance C1b. Accordingly, a pre-set third capacitance C3a that is pre-set by the arithmetic formula may be greater than a targeted third capacitance C3b.

Solid lines in FIG. 14 may illustrate a case of the distant plane group and dotted lines may illustrate a case of the nearby plane group. Unlike shown in FIG. 16A, the voltage levels of the BLSHF and the decoupling capacitor DC in FIG. 16B may be at voltage levels lower than the precharge voltage V_PRE after the charge sharing. Thereafter, the voltage level of the BLSHF may be increased by the BLSHF generator 400 and thus, the distant plane group may reach the precharge voltage V_PRE later than the nearby plane group. Accordingly, the bit line BL of the distant plane group may begin precharge at the time T3 and the bit line BL of the nearby plane group may begin the precharge at the time T2. Thereafter, the precharge of the distant plane group may be complete at a time T5 and the precharge of the nearby plane group may be complete at the time T4. Thus, a difference of (T5-T4) may occur. However, the BLSHF may be pre-charged at a more rapid speed in the beginning even when the pre-set third capacitance C3a that is pre-set as in FIG. 16B is greater than the targeted third capacitance C3b. Thus, the difference of (T5-T4) in the precharge completion time between the distant and nearby plane groups may be reduced with respect to the case without the decoupling capacitor DC.

Figure 16C:
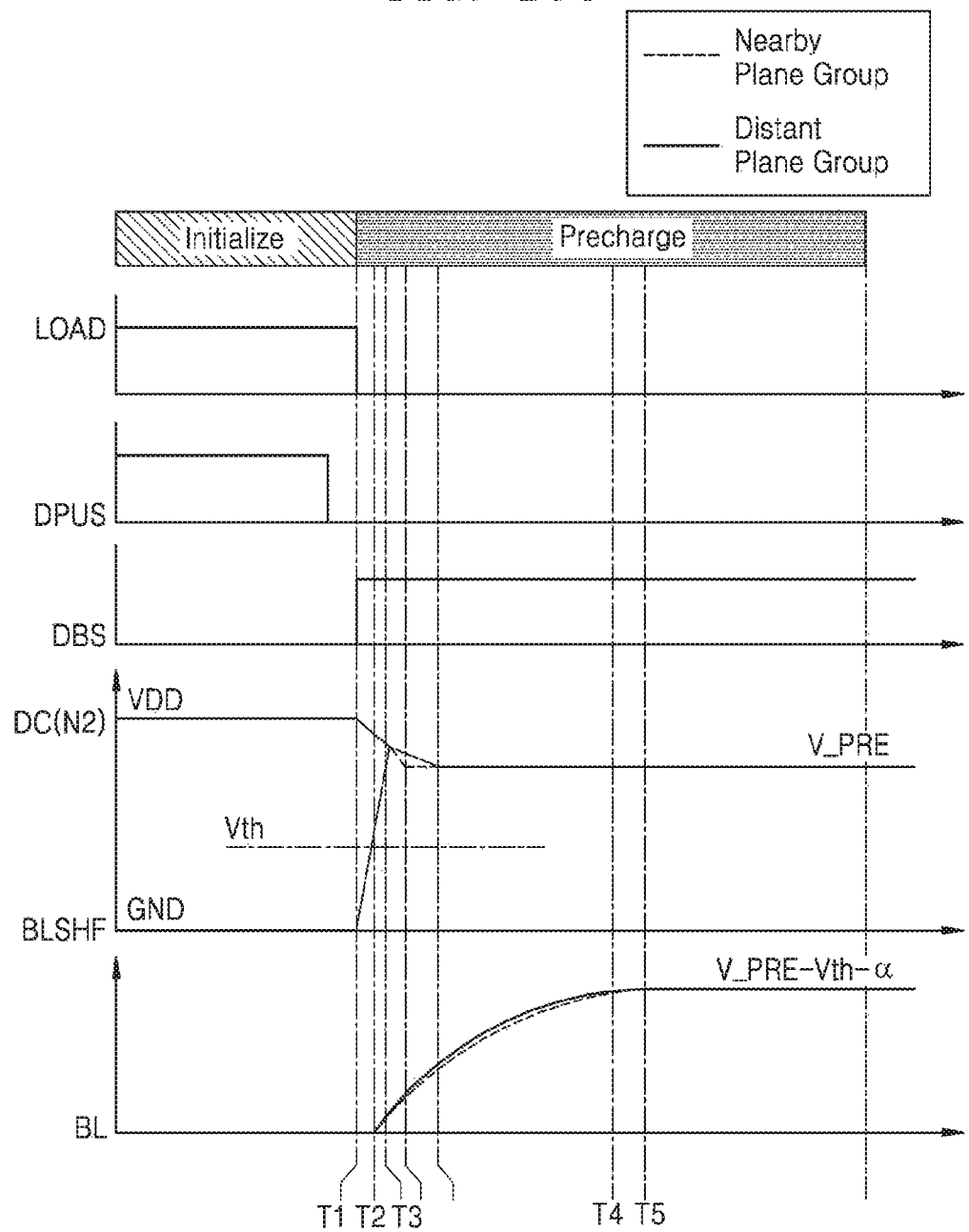
FIG. 16C is a timing diagram of an initializing stage and a pre-charge stage of a plane group according to some example embodiments of inventive concepts.

FIG. 16C is a timing diagram of an initializing stage and a pre-charge stage of a plane group according to some example embodiments of inventive concepts. In detail, FIG. 16C illustrates a case when the third capacitance C3 of the decoupling capacitor DC is set to be less than a target value.

Descriptions of content overlapping with content in FIGS. 16A and 16B will be omitted.

Referring to FIGS. 4, and 16A through 16C, the third capacitance C3 may satisfy a formula, C3=C1×(VDD/V_PRE−1). In this case, the third capacitance C3 may be set to satisfy the arithmetic formula by estimating the first capacitance C1 of the plane equivalent capacitor in a manufacturing process. However, the estimated first capacitance C1a may be more or less different from the actual first capacitance C1b. FIG. 16A may illustrate a case when the estimated first capacitance C1a is less than the actual first capacitance C1b. Accordingly, the pre-set third capacitance C3a that is pre-set by the arithmetic formula may be less than the targeted third capacitance C3b.

Solid lines in FIG. 14 may illustrate a case of a distant plane group and dotted lines may illustrate a case of a nearby plane group. Unlike shown in FIG. 16A, the voltage levels of the BLSHF and the decoupling capacitor DC in FIG. 16C may be at voltage levels lower than the precharge voltage V_PRE after the charge sharing. Thereafter, the voltage level of the BLSHF may be increased by the BLSHF generator 400 and thus, the distant plane group may reach the precharge voltage V_PRE later than the nearby plane group. Accordingly, the bit line BL of the distant plane group may begin precharge at the time T3 and the bit line BL of the nearby plane group may begin the precharge at the time T2. Thereafter, the precharge of the distant plane group may be complete at a time T5 and the precharge of the nearby plane group may be complete at the time T4. Thus, a difference of (T5−T4) may occur. However, the BLSHF may be precharged at a more rapid speed in the beginning even when the pre-set third capacitance C3a that is pre-set as in FIG. 16C is less than the targeted third capacitance C3b. Thus, the difference of (T5−T4) in the precharge completion time between the distant and nearby plane groups may be reduced with respect to the case without the decoupling capacitor DC.

Figure 17:
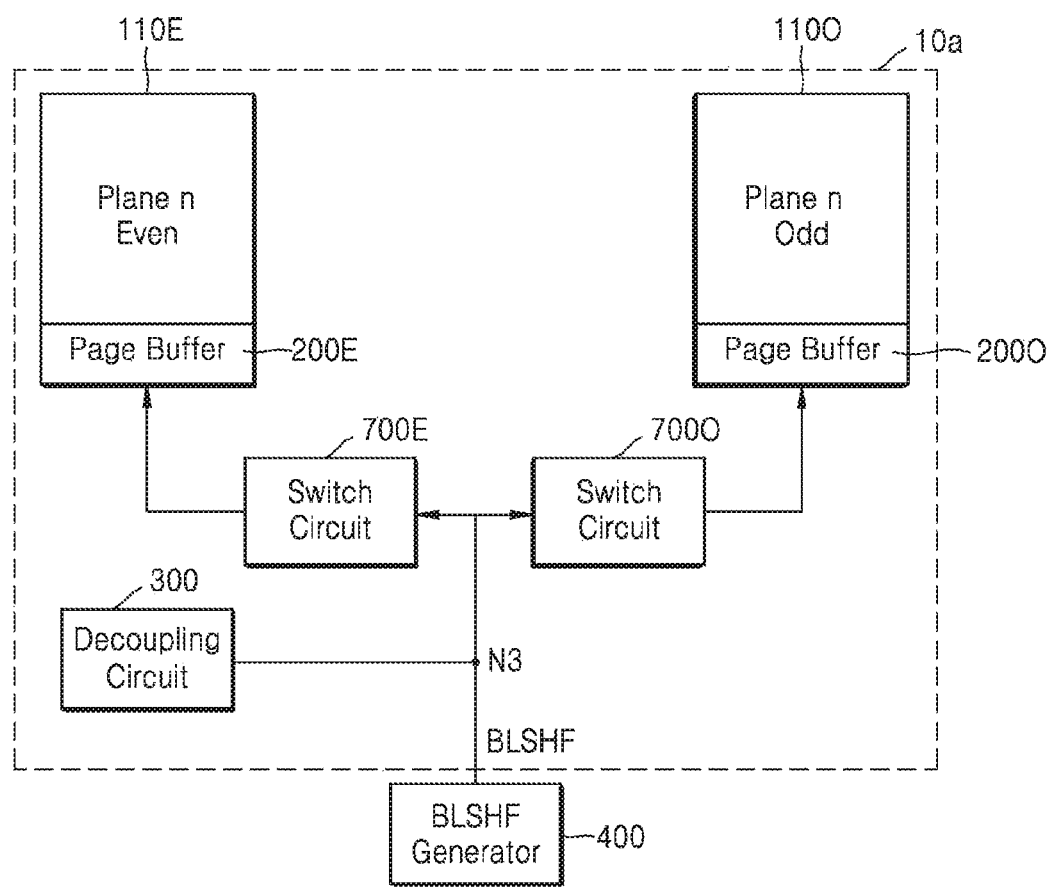
FIG. 17 is a block diagram of a plane group and a bit line voltage control signal generator according to some example embodiments of inventive concepts.

FIG. 17 is a block diagram of a plane group 10a and the BLSHF generator 400 according to some example embodiments of inventive concepts. Descriptions of content overlapping with content in FIG. 3 will be omitted.

Referring to FIGS. 3 and 17, the plane group 10a may include the even plane 110E, an even page buffer 200E, an even switch circuit 700E, the odd plane 110O, an odd page buffer 200O, an odd switch circuit 700O, and the decoupling circuit 300. Unlike in FIG. 3, in FIG. 17, the decoupling circuit 300 may be connected to a third node N3 having the even switch circuit 700E and the odd switch circuit 700O connected thereto, according to some example embodiments.

The decoupling circuit 300 may be connected to the third node N3 and execute the charge sharing for the even and odd planes 110E and 110O. When the charge sharing is executed for only the even plane 110E, decoupling for the even plane 110E may be executed by switching the by-pass switch included in the even switch circuit 700E. When the charge sharing is executed only for the odd plane 110O, the decoupling for the odd plane 110O may be executed by switching the by-pass switch included in the odd switch circuit 700E. The decoupling circuit 300, which is located in each plane, may execute the charge sharing for a corresponding plane.

Figure 18:
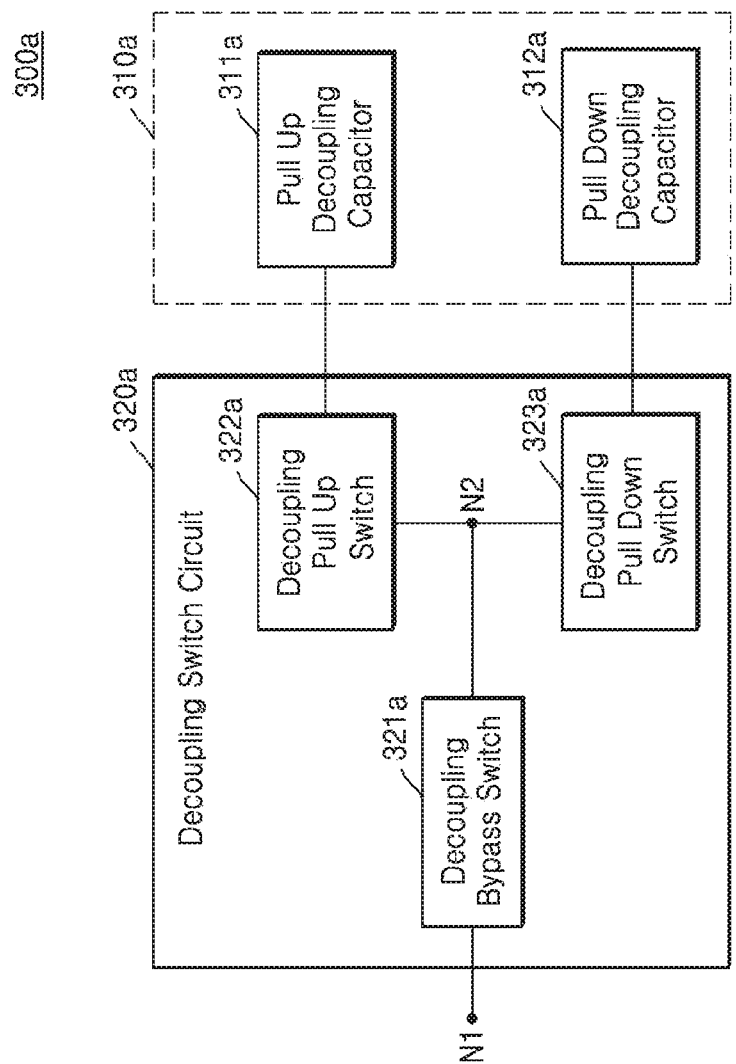
FIG. 18 is a block diagram of a decoupling circuit according to some example embodiments of inventive concepts.

FIG. 18 is a block diagram of a decoupling circuit 300a according to some example embodiments of inventive concepts. Descriptions of content overlapping with content in FIG. 10 will be omitted.

Referring to FIGS. 10 and 18, the decoupling circuit 300a may include a decoupling capacitor circuit 310a and a decoupling switch circuit 320a. The decoupling capacitor circuit 310a may include a pull-up decoupling capacitor 311a connected to a decoupling pull-up switch 322a and a pull-down decoupling capacitor 312a connected to a decoupling pull-down switch 323a.

The pull-up decoupling capacitor 311a may be charged to the power voltage VDD as described in detail in FIGS. 16A through 16C. The pull-down decoupling capacitor 312a may be discharged to the ground voltage GND as described in FIG. 15. Thereafter, in the precharge stage, the pull-up decoupling capacitor 311a may be connected to the first node N1 via the decoupling by-pass switch 321a and execute the charge sharing to the precharge voltage V_PRE. In the develop stage, the pull-down decoupling capacitor 312a may be connected to the first node N1 and execute the charge sharing to the develop voltage V_DEV.

Figure 19:
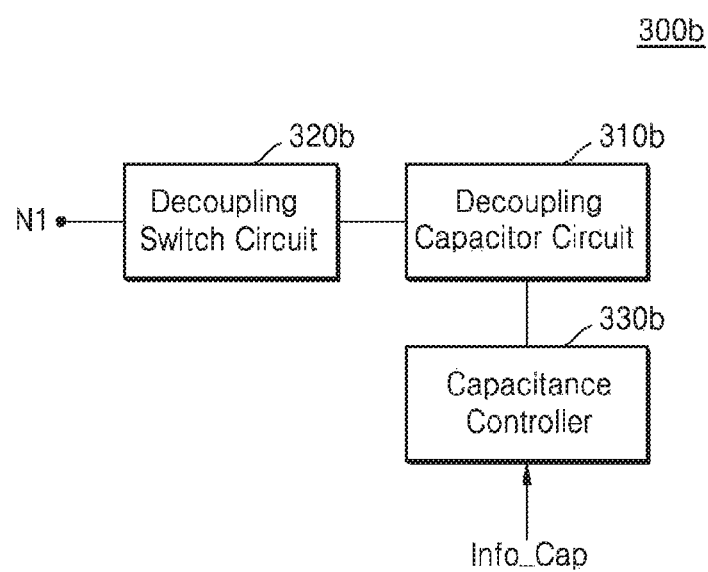
FIG. 19 is a decoupling circuit according to some example embodiments of inventive concepts.

FIG. 19 is a block diagram of a decoupling circuit 300b according to some example embodiments of inventive concepts. Descriptions of content overlapping with content in FIG. 10 will be omitted.

Referring to FIGS. 10 and 19, the decoupling circuit 300b may include a decoupling capacitor circuit 310b, a decoupling switch circuit 320b, and a capacitance controller 330b. Since the decoupling capacitor circuit 310b and the decoupling switch circuit 320b are similar to the decoupling capacitor circuit 310 and the decoupling switch circuit 320 described in FIG. 10, etc., descriptions thereof will be omitted.

As described in FIGS. 4, 16A, etc., the second capacitance C2 may be set to satisfy the formula, C2=C1×(V_PRE/V_DEV−1) and the third capacitance C3 may set to satisfy the formula, C3=C1×(VDD/V_PRE−1). However, the actual first capacitance C1b of the plane equivalent capacitor 22 may be different from the estimated first capacitance C1a. The capacitance controller 330b may receive capacitance information Info_Cap about the actual first capacitance C1b. The capacitance controller 330b may adjust the second capacitance C2 and the third capacitance C3 toward the actual first capacitance C1b by using the received capacitance information Info_Cap and the two arithmetic formulas.

Figure 20:
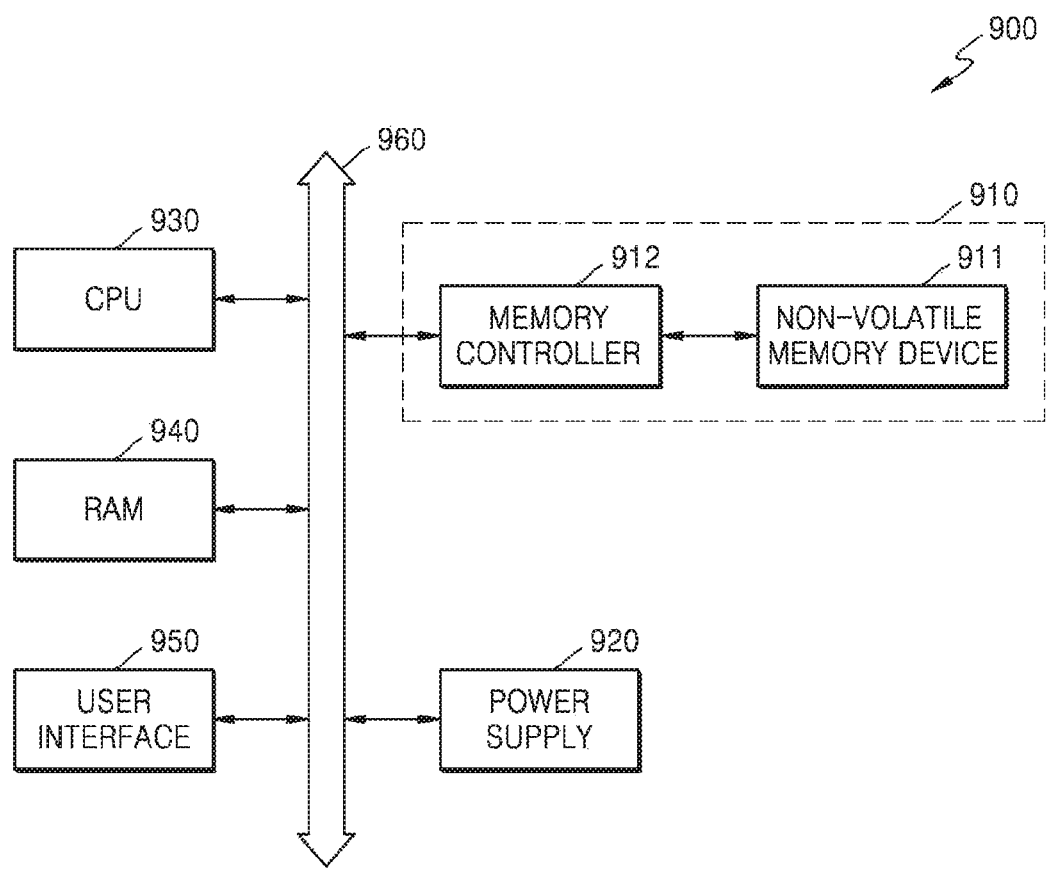
FIG. 20 is a block diagram of a computing system apparatus including a non-volatile memory system according to some example embodiments of inventive concepts.

FIG. 20 is a block diagram of a computing system apparatus 900 including a non-volatile memory system 910 according to some example embodiments of inventive concepts.

Referring to FIG. 20, the computing system apparatus 900 may include a microprocessor 930 electrically connected to a bus 960, a user interface 950, and a non-volatile memory system 910 including a memory controller 912 and a non-volatile memory device 911. N-bit data (N is an integer of 1 or larger) that has been or is to be processed by a microprocessor 930 may be stored in the non-volatile memory device 911 via the memory controller 912. In addition, the non-volatile memory device 911 may include the non-volatile memory device described in FIGS. 1 through 19. The computing system apparatus 900 may further include a RAM 940 and a power supply 920.

When the computing system apparatus 900 is a mobile apparatus, a battery for supplying a driving voltage to a computing system and a modem such as a baseband chipset may be additionally provided thereto. In addition, it will be clearly understood by one of ordinary skill in the art that an application chipset, a camera image processor (CIS), a mobile DRAM, etc. may be further provided to the computing system apparatus 900, and additional detailed descriptions thereof will be omitted.

In some example embodiments, the memory controller 912 and the non-volatile memory device 911 may form, for example, a solid state drive/disk (SSD) which uses a non-volatile memory for storing data.

While some inventive concepts has been particularly shown and described, it will be understood that various changes in form and details may be made therein without departing from the spirit and scope of the following claims.

What is claimed is:

1. A method of sensing a memory cell comprised in a non-volatile memory cell array, the method comprising:
   precharging a first node to a precharge voltage, the precharge voltage being greater than a ground voltage and less than a supply voltage;
   discharging a first decoupling capacitor to the ground voltage, the first decoupling capacitor arranged so the first node is between the memory cell and the first decoupling capacitor; and
   developing the first node to a develop voltage through charge sharing between the first node and the first decoupling capacitor, the develop voltage being greater than the ground voltage and less than the precharge voltage.

2. The method of claim 1, wherein the developing comprises:
   outputting a bit line voltage control signal (BLSHF) having a level of the develop voltage to the first node; and
   connecting the first decoupling capacitor discharged to the ground voltage to the first node.

3. The method of claim 2, wherein
   the non-volatile memory cell array comprises a plurality of planes, and
   each of the plurality of planes comprises, the first decoupling capacitor configured to execute the charge sharing.

4. The method of claim 3, wherein
   the outputting of the BLSHF comprises outputting the BLSHF commonly to the plurality of planes, and
   the connecting of the first decoupling capacitor comprises connecting the first decoupling capacitor comprised in each of the plurality of planes to a corresponding node.

5. The method of claim 1, further comprising:
   charging the first decoupling capacitor to the supply voltage.

6. The method of claim 5, wherein
   the precharging comprises executing the charge sharing between the first decoupling capacitor charged to the supply voltage and the first node.

7. The method of claim 6, wherein
   the first decoupling capacitor is connected to a first plane and a first page buffer via the first node,
   the first plane and the first page buffer have a first equivalent capacitance (C1),
   the first decoupling capacitor has a second decoupling capacitance (C2),
   the first node and the first decoupling capacitor reach a level of an identical voltage at a level of a first voltage according to an operation of executing the charge sharing, and
   C2 satisfies an arithmetic formula, C2=C1×(V_PRE/V_DEV−1),
   V_PRE is the precharge voltage and V_DEV is the develop voltage for the first plane, and
   the level of the first voltage is identical to a level of the V_PRE.

8. The method of claim 6, wherein
   the first decoupling capacitor is connected to a first plane and a first page buffer via the first node,
   the first plane and the first page buffer have a first equivalent capacitance (C1),
   the first decoupling capacitor has a second decoupling capacitance (C2), the first node and the first decoupling capacitor reach a level of an identical voltage at a level of a first voltage according to an operation of executing the charge sharing, and
   C2 is greater than a value of C1×(V_PRE/V_DEV−1),
   V_PRE is the precharge voltage and V_DEV is the develop voltage for the first plane, and
   the level of the first voltage is less than a level of the V_PRE.

9. The method of claim 6, wherein
   the first decoupling capacitor is connected to a first plane and a first page buffer via the first node, the first plane and the first page buffer have a first equivalent capacitance (C1),
   the first decoupling capacitor has a second decoupling capacitance (C2),
   the first node and the first decoupling capacitor reach a level of an identical voltage at a level of a first voltage according to an operation of executing the charge sharing, and
   C2 is less than a value of C1×(V_PRE/V_DEV−1),
   V_PRE is the precharge voltage and V_DEV is the develop voltage for the first plane, and
   the level of the first voltage is greater than a level of the V_PRE.

10. The method of claim 5, wherein the precharging comprises:
    outputting a bit line voltage control signal (BLSHF) having a level of the pry charge voltage to the first node; and
    connecting the first decoupling capacitor charged to the supply voltage to the first node.

11. The method of claim 1, wherein the precharging comprises:
    charging a second decoupling capacitor to the supply voltage; and
    connecting the second decoupling capacitor charged to the supply voltage to the first node.

12. The method of claim 1, wherein
    the non-volatile memory cell array comprises a plurality of planes each comprising a first decoupling capacitor, and
    capacitance of the first decoupling capacitor is different per the plurality of planes.

13. A method of sensing a memory cell comprised in a non-volatile memory cell array, the method comprising:
    charging a first decoupling capacitor to a supply voltage;
    precharging a first node to a precharge voltage by executing charge sharing between the first decoupling capacitor charged to the supply voltage and the first node, a level of the precharge voltage being greater than a level of the ground voltage and less than a level of the supply voltage; and
    developing the first node to a develop voltage, a level, of the develop voltage being greater than the level of the ground voltage and less than the level of the precharge voltage.

14. The method of claim 13, wherein the precharging comprises:

outputting a hit line voltage control signal (BLSHF) having the level of the precharge voltage to the first node; and connecting the first decoupling capacitor charged to the supply voltage to the first node.

15. The method of claim 14, wherein
the first decoupling capacitor is connected to a first plane and a first page buffer via the first node,
the first plane and the first page buffer have a first equivalent capacitance (C1),
the first decoupling capacitor has a second decoupling capacitance (C2),
the first node and the first decoupling capacitor reach a level of an identical voltage at a level of a first voltage according to an operation of executing the charge sharing, and
C2 satisfies the arithmetic formula, C2=C1×(V_PRE/V_DEV−1),
V_PRE is the precharge voltage and V_DEV is the develop voltage for the first plane, and
the level of the first voltage is identical to a level of the V_PRE.

16. A non-volatile memory device comprising:
a memory cell array comprising a plurality of planes;
a page buffer arranged corresponding to each plane, the page buffer configured to receive a bit line voltage control signal (BLSHF) via a first node;
a decoupling circuit comprising at least one decoupling capacitor, the decoupling circuit configured to execute charge sharing via the first node; and
a decoupling switch circuit configured to control a connection between the decoupling circuit and the first node,
wherein the decoupling switch circuit comprises:
a decoupling by-pass switch configured to control a connection between the at least one decoupling capacitor and the first node, and
at least one of a decoupling pull-up switch configured to control an application of a supply voltage to the at least one decoupling capacitor and a decoupling pull-down switch configured to control an application of a ground voltage to the decoupling capacitor.

17. The non-volatile memory device of claim 16, wherein the decoupling switch circuit comprises both the decoupling pull-up switch and the decoupling pull-down switch.

18. The non-volatile memory device of claim 17, wherein after the decoupling capacitor is discharged to the ground voltage by the decoupling pull-down switch, the decoupling capacitor is connected to the first node by the decoupling by-pass switch and configured to execute the charge sharing.

19. The non-volatile memory device of claim 17, wherein after the decoupling capacitor is charged to the supply voltage by the decoupling pull-up switch, the decoupling capacitor is connected, to the first node and configured to execute the charge sharing, and
then, after the decoupling capacitor is discharged to the ground voltage by the decoupling pull-down switch, the decoupling capacitor is connected to the first node by the decoupling by-pass switch and configured to execute the charge sharing.

20. The non-volatile memory device of claim 17, wherein the decoupling circuit comprises a first decoupling capacitor and a second decoupling capacitor,
the first decoupling capacitor is connected to the decoupling pull-up switch and changed to the supply voltage,
the second decoupling capacitor is connected tai the decoupling pull-down switch and discharged to the ground voltage, and
the first decoupling capacitor and the second decoupling capacitor are sequentially connected to the first node and configured to respectively execute the charge sharing.

* * * * *